(12) United States Patent
Kimura et al.

(10) Patent No.: US 11,848,599 B2
(45) Date of Patent: Dec. 19, 2023

(54) DRIVE CIRCUIT FOR DRIVING AN UPPER ARM SWITCH AND A LOWER ARM SWITCH EACH HAVING A BODY DIODE

(71) Applicant: DENSO CORPORATION, Kariya (JP)

(72) Inventors: Mitsunori Kimura, Kariya (JP); Yoshinori Hayashi, Kariya (JP); Kengo Mochiki, Kariya (JP)

(73) Assignee: DENSO CORPORATION, Kariya (JP)

( * ) Notice: Subject to any disclaimer, the term of this patent is extended or adjusted under 35 U.S.C. 154(b) by 217 days.

(21) Appl. No.: 16/840,985

(22) Filed: Apr. 6, 2020

(65) Prior Publication Data
US 2020/0235653 A1 Jul. 23, 2020

Related U.S. Application Data

(63) Continuation of application No. PCT/JP2018/033781, filed on Sep. 12, 2018.

(30) Foreign Application Priority Data

Oct. 4, 2017 (JP) .................................. 2017-194569

(51) Int. Cl.
*H02M 1/08* (2006.01)
*H03K 17/0814* (2006.01)
(Continued)

(52) U.S. Cl.
CPC .......... *H02M 1/08* (2013.01); *H03K 17/0822* (2013.01); *H03K 17/08142* (2013.01);
(Continued)

(58) Field of Classification Search
CPC ........ H02M 1/08; H02M 1/081; H02M 1/082; H02M 1/083; H02M 1/084; H02M 1/0845;
(Continued)

(56) References Cited

U.S. PATENT DOCUMENTS

2008/0265975 A1 10/2008 Takasu et al.
2013/0181749 A1* 7/2013 Hamanaka ............. H03K 17/56
327/109

FOREIGN PATENT DOCUMENTS

JP 2016-046831 A 4/2016
WO 2016/143023 A1 9/2016

OTHER PUBLICATIONS

Oct. 9, 2018 International Search Report issued in International Patent Application No. PCT/JP2018/033781.

* cited by examiner

*Primary Examiner* — Thienvu V Tran
*Assistant Examiner* — Carlos O Rivera-Perez
(74) *Attorney, Agent, or Firm* — Oliff PLC

(57) ABSTRACT

A drive circuit for a switch drives an upper-arm switch and a lower-arm switch that include body diodes. Of the body diodes in upper- and lower-arm switches, the diode through which a feedback current flows during a dead time is a target diode. Of the upper- and lower-arm switches, the switch that includes the target diode is a target switch. The remaining switch is an opposing arm switch. The drive circuit maintains an electric potential of a control terminal relative to a second terminal of the target switch at a negative voltage over a period from a timing subsequent to a start timing of a dead time immediately after the target switch is switched to an off-state until a point within a period over which the opposing arm switch is set to an on-state, and subsequently maintains the electric potential at an off-voltage until a next dead time is ended.

2 Claims, 15 Drawing Sheets

(51) Int. Cl.
*H03K 17/082* (2006.01)
*H03K 17/284* (2006.01)
*H03K 17/687* (2006.01)
*H02M 1/00* (2006.01)

(52) U.S. Cl.
CPC ......... *H03K 17/284* (2013.01); *H03K 17/687* (2013.01); *H02M 1/0009* (2021.05)

(58) Field of Classification Search
CPC ............ H02M 1/0009; H02M 1/0029; H02M 1/0048; H02M 1/0051; H02M 1/0058; H02M 7/00; H02M 7/42; H02M 7/44; H02M 7/48; H02M 7/515; H02M 7/521; H02M 7/537; H02M 7/538466; H02M 7/53862; H02M 7/5387; H02M 7/53871; H02M 7/53875; H03K 17/0814; H03K 17/08142; H03K 17/082; H03K 17/0822; H03K 17/0812; H03K 17/08122; H03K 17/28; H03K 17/284; H03K 17/687; H03K 17/6871; H03K 2017/066; H03K 2217/0081; Y02B 70/10
USPC ................ 323/219, 235, 271, 272, 274–278, 323/282–285, 289, 351; 363/16, 17, 363/40–43, 50, 56.01, 56.02, 95–99, 363/131–134; 327/108–112
See application file for complete search history.

FIG.5
⟨ CURRENT ⟩ 0 ⟩
(a) P1
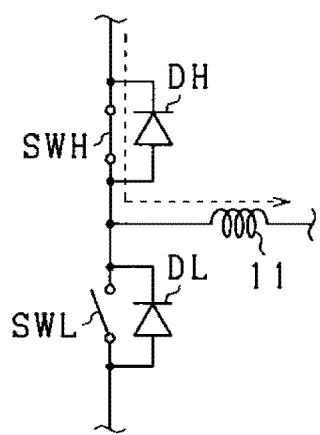
(b) P2
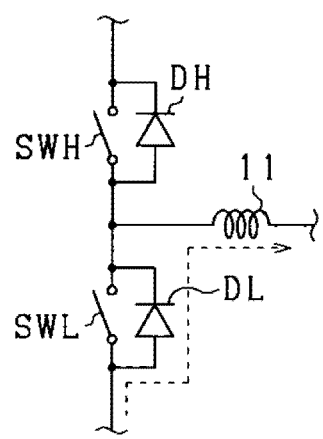
(c) P3
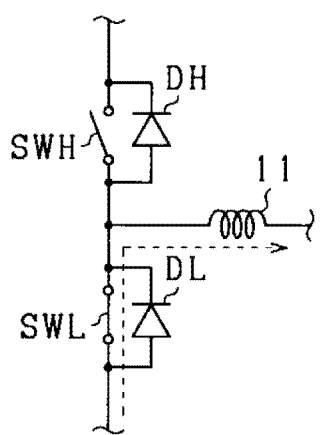
(d) P4
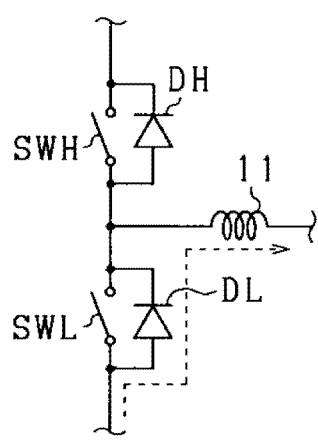

FIG.6
⟨ CURRENT ⟨ 0 ⟩ ⟩
(a) P3
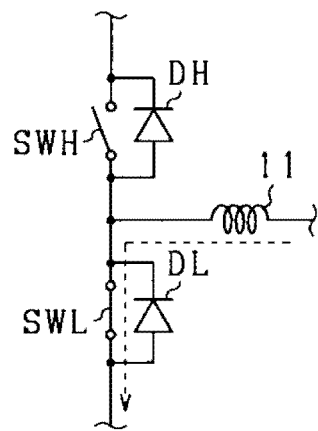
(b) P4
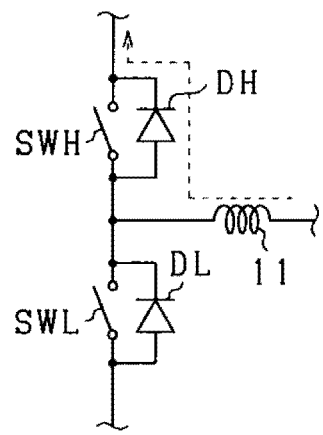
(c) P1
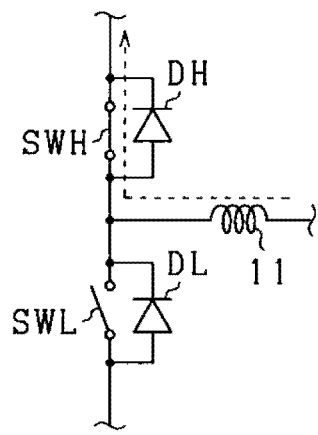
(d) P2
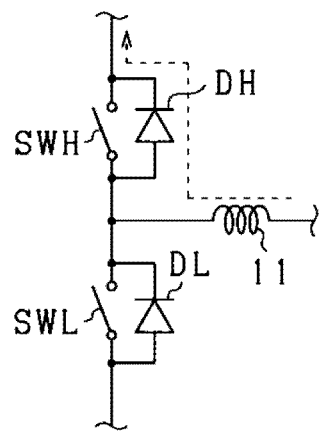

DRIVE CIRCUIT FOR DRIVING AN UPPER ARM SWITCH AND A LOWER ARM SWITCH EACH HAVING A BODY DIODE

CROSS-REFERENCE TO RELATED APPLICATIONS

The present application is a continuation application of International Application No. PCT/JP2018/033781, filed Sep. 12, 2018, which claims priority to Japanese Patent Application No. 2017-194569, filed on Oct. 4, 2017. The contents of these applications are incorporated herein by reference in their entirety.

BACKGROUND

Technical Field

The present disclosure relates to a drive circuit for a switch that drives upper- and lower-arm switches that include body diodes.

Related Art

As this type of drive circuit, a drive circuit that drives upper- and lower-arm switches that are connected to each other in series is known. For example, the upper- and lower-arm switches are metal-oxide-semiconductor field-effect transistors (MOSFETs). The upper- and lower-arm switches include first terminals, second terminals, and control terminals. The upper- and lower-arm switches are set to an on-state that allows a flow of current between the first terminal and the second terminal, as a result of a potential difference in the control terminal relative to the second terminal becoming equal to or greater than a threshold voltage. Meanwhile, the upper- and lower-arm switches are set to an off-state that inhibits a flow of current in a direction from the first terminal towards the second terminal, as a result of the above-described potential difference becoming less than the threshold voltage. The drive circuit alternately sets the upper- and lower-arm switches to the on-state, while interposing a dead time between the on-state of the upper-arm switch and the on-state of the lower-arm switch.

SUMMARY

One aspect of the present disclosure provides a drive circuit for a switch that drives an upper-arm switch and a lower-arm switch that include body diodes. Of the body diodes in upper- and lower-arm switches, the diode through which a feedback current flows during a dead time is a target diode. Of the upper- and lower-arm switches, the switch that includes the target diode is a target switch. The remaining switch is an opposing arm switch. The drive circuit maintains an electric potential of a control terminal, relative to a second terminal of the target switch, at a negative voltage over a period from a timing subsequent to a start timing of a dead time immediately after the target switch is switched to an off-state until a point within a period over which the opposing arm switch is set to an on-state, and subsequently maintains the electric potential at an off-voltage until a next dead time is ended.

BRIEF DESCRIPTION OF THE DRAWINGS

In the accompanying drawings:

FIG. 5 is a diagram of an aspect of current flow when a phase current is positive;

FIG. 6 is a diagram of an aspect of current flow when the phase current is negative;

DESCRIPTION OF THE EMBODIMENTS

Figure 1:
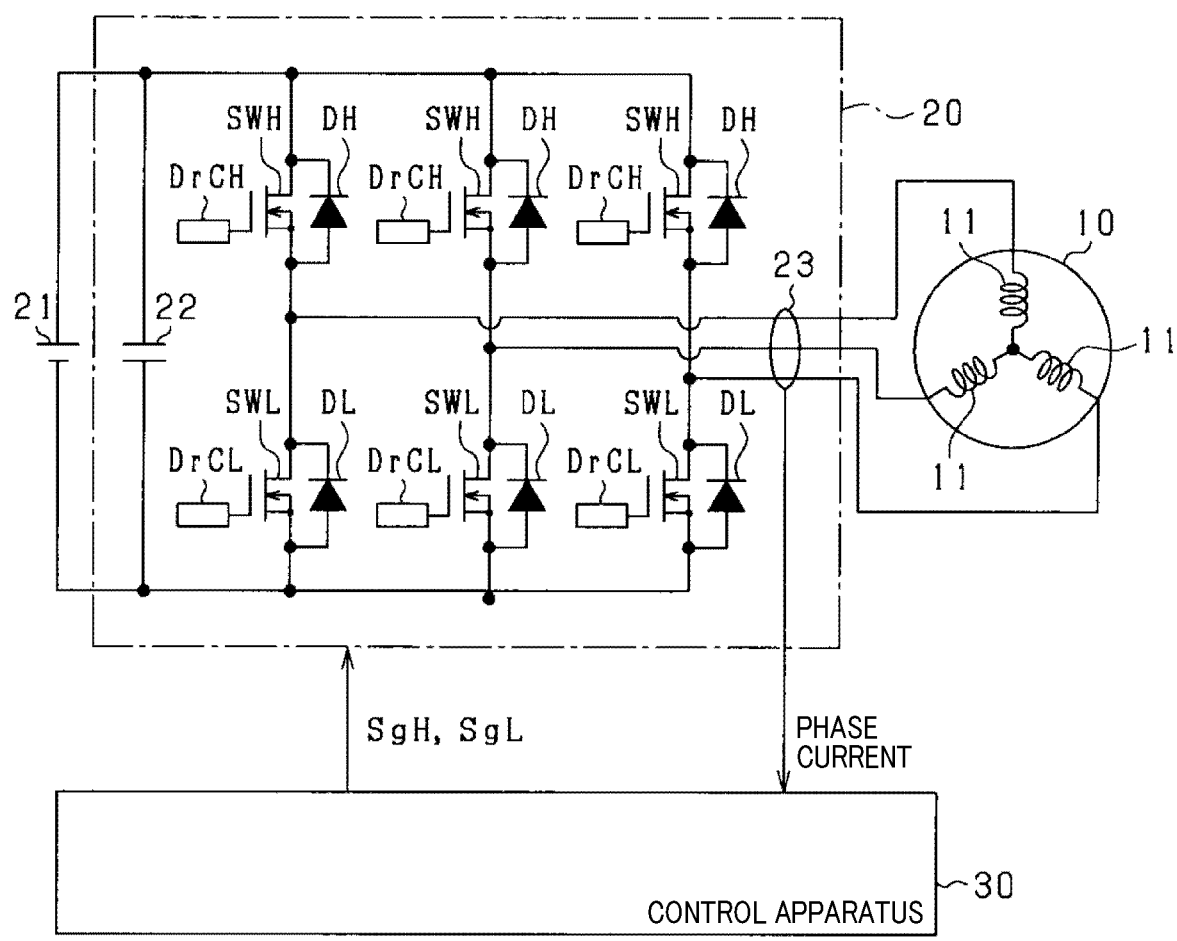
FIG. 1 is a diagram of an overall configuration of a control system for a rotating electric machine according to a first embodiment.

The upper- and lower-arm switches have feedback capacitance that is formed between each of the first terminal and the control terminal, and the second terminal and the control terminal. For example, if the upper-arm switch is switched to the on-state when the lower-arm switch is set to the off-state, electric charge might be supplied to the control terminal of the lower-arm switch through the feedback capacitance. In this case, the potential difference in the control terminal relative to the second terminal is equal to or greater than the threshold voltage. A phenomenon in which the lower-arm switch is erroneously switched to the on-state regardless of a desire to keep the lower-arm switch in the off-state may occur. Hereafter, this phenomenon is referred to as self turn-on.

As a technology for suppressing the occurrence of self turn-on, WO2016/143023 discloses a technology in which the potential difference in the control terminal relative to the second terminal of the lower-arm switch is held at a negative voltage that is less than 0, over a period from a timing that is immediately before switching of the upper-arm switch to the on-state until a next dead time ends. As a result, the occurrence of self turn-on in the lower-arm switch is suppressed.

When the potential difference in the control terminal relative to the second terminal is held at the negative voltage, compared to when the potential difference is held at equal to or greater than 0 and less than the threshold voltage, progression in deterioration of the switch becomes a concern. Therefore, in terms of suppressing the progression of deterioration of the switch, the period over which the potential difference is held at the negative voltage is preferably shortened.

It is thus desired to provide a drive circuit for a switch that is capable of suppressing progression of deterioration of the switch.

An exemplary embodiment provides a drive circuit for a switch that drives an upper-arm switch and a lower-arm switch that include body diodes. Each of the upper-arm switch and the lower-arm switch includes a first terminal, a second terminal, and a control terminal, and the second terminal of the upper-arm switch is connected to the first terminal of the lower-arm switch. Each of the upper-arm switch and the lower-arm switch is set to an on-state that allows a flow of current between the first terminal and the second terminal, as a result of a potential difference in the control terminal relative to the second terminal becoming equal to or greater than a threshold voltage, and an off-state that inhibits a flow of current in a direction from the first terminal towards the second terminal, as a result of the potential difference in the control terminal relative to the second terminal becoming less than the threshold voltage.

The exemplary embodiment includes: a voltage adjusting unit that adjusts applied voltages of the respective control terminals of the upper-arm switch and the lower-arm switch by having energization thereof controlled; and a control unit that performs energization control of the voltage adjusting unit such that the upper-arm switch and the lower-arm switch are alternately set to the on-state while interposing a dead time between the on-state of the upper-arm switch and the on-state of the lower-arm switch.

The control unit performs energization control of the voltage adjusting unit so as to maintain the electric potential of the control terminal relative to the second terminal of a target switch at the negative voltage over a period from a timing subsequent to a start timing of a dead time immediately after the target switch is switched to the off-state, until a point within a period over which the opposing arm switch is set to the on-state, and subsequently maintain the electric potential of the control terminal relative to the second terminal of the target switch at an off-voltage until a next dead time is ended.

When, among the body diodes respectively included in the upper-arm switch and the lower-arm switch, the diode through which a feedback current flows during the dead time is a target diode, among the upper-arm switch and the lower-arm switch, the switch that includes the target diode is a target switch, and the remaining switch is an opposing arm switch, and a voltage that is equal to or greater than 0 and less than the threshold voltage is an off-voltage and a voltage that is less than 0 is a negative voltage, In the exemplary embodiment, the target diode, the target switch, the opposing arm switch, the off-voltage, and the negative voltage are defined as described above. Here, the period from the timing subsequent to the start timing of the dead time, of the dead time immediately after the target switch is switched to the off-state, until a point within a period over which the opposing arm switch is set to the on-state is a prescribed period. In this case, to suppress the occurrence of self turn-on of the target switch when the opposing arm switch is switched to the on-state, the electric potential of the control terminal relative to the second terminal of the target switch may be maintained at the negative voltage over the prescribed period.

Here, the control unit of the present disclosure performs energization control of the voltage adjusting unit so as to maintain the electric potential of the control terminal relative to the second terminal of the target switch at the negative voltage over the period from the timing subsequent to the start timing of the dead time, of the dead time immediately after the target switch is switched to the off-state, until a point within a period over which the opposing arm switch is set to the on-state. As a result, the occurrence of self turn-on of the target switch is suppressed.

In addition, the control unit performs energization control of the voltage adjusting unit so as to maintain the electric potential of the control terminal relative to the second terminal of the target switch at the off-voltage until a next dead time is ended. As a result, compared to the configuration described in above-described WO2016/143023, the period over which the negative voltage is maintained can be shortened and progression of deterioration of the switch can be suppressed.

First Embodiment

A first embodiment actualizing a drive circuit for a switch of the present disclosure will hereinafter be described with reference to the drawings.

As shown in FIG. 1, a control system includes a rotating electric machine 10, an inverter 20, and a control apparatus 30. The inverter 20 serves as a power converter. The rotating electric machine 10 is a target that is controlled by the control apparatus 30. According to the present embodiment, the rotating electric machine 10 includes windings 11 of three phases that are connected by a star connection. For example, the rotating electric machine 10 may be a synchronous machine.

The rotating electric machine 10 is connected to a direct-current power supply 21 through the inverter 20. For example, the direct-current power supply 21 is a secondary battery. Here, a smoothing capacitor 22 is provided between the direct-current power supply 21 and the inverter 20.

The inverter 20 includes series-connection bodies of upper-arm switches SWH and lower-arm switches SWL amounting to three phases. According to the present embodiment, as each of the switches SWH and SWL, an N-channel MOSFET that is a unipolar element and a wide-bandgap semiconductor, such as SiC or GaN, is used. An upper-arm diode DH that serves as a body diode is provided in the upper-arm switch SWH. A lower-arm diode DL that serves as a body diode is provided in the lower-arm switch SWL. In each of the switches SWH and SWL according to the present embodiment, a drain corresponds to a first terminal, a source corresponds to a second terminal, and a gate corresponds to a control terminal.

For each phase, a first end of the winding 11 of the rotating electric machine 10 is connected to a connection point between the source of the upper-arm switch SWH and the drain of the lower-arm switch SWL. A second end of the winding 11 of each phase is connected by a neutral point. Here, according to the present embodiment, the winding 11 corresponds to an inductive load.

The control system includes a phase current detecting unit 23. The phase current detecting unit 23 detects currents amounting to at least two phases, among phase currents flowing to the rotating electric machine 10.

The control apparatus 30 controls the inverter 20 to control a controlled variable of the rotating electric machine 10 to a command value. For example, the controlled variable is torque. The control apparatus 30 outputs, to upper- and lower-arm drive circuits DrCH and DrCL that are individually provided for the upper- and lower-arm switches SWH and SWL, upper- and lower-arm driving signals SgH and SgL that correspond to the upper- and lower-arm switches SWH and SWL, to alternately turn on the upper- and lower-arm switches SWH and SWL while interposing a dead time between the on-state of the upper-arm switch SWH and the on-state of the lower-arm switch SWL. The driving signal is either of an on-command that commands switching of the switch to an on-state and an off-command that commands switching of the switch to an off-state.

Figure 2:
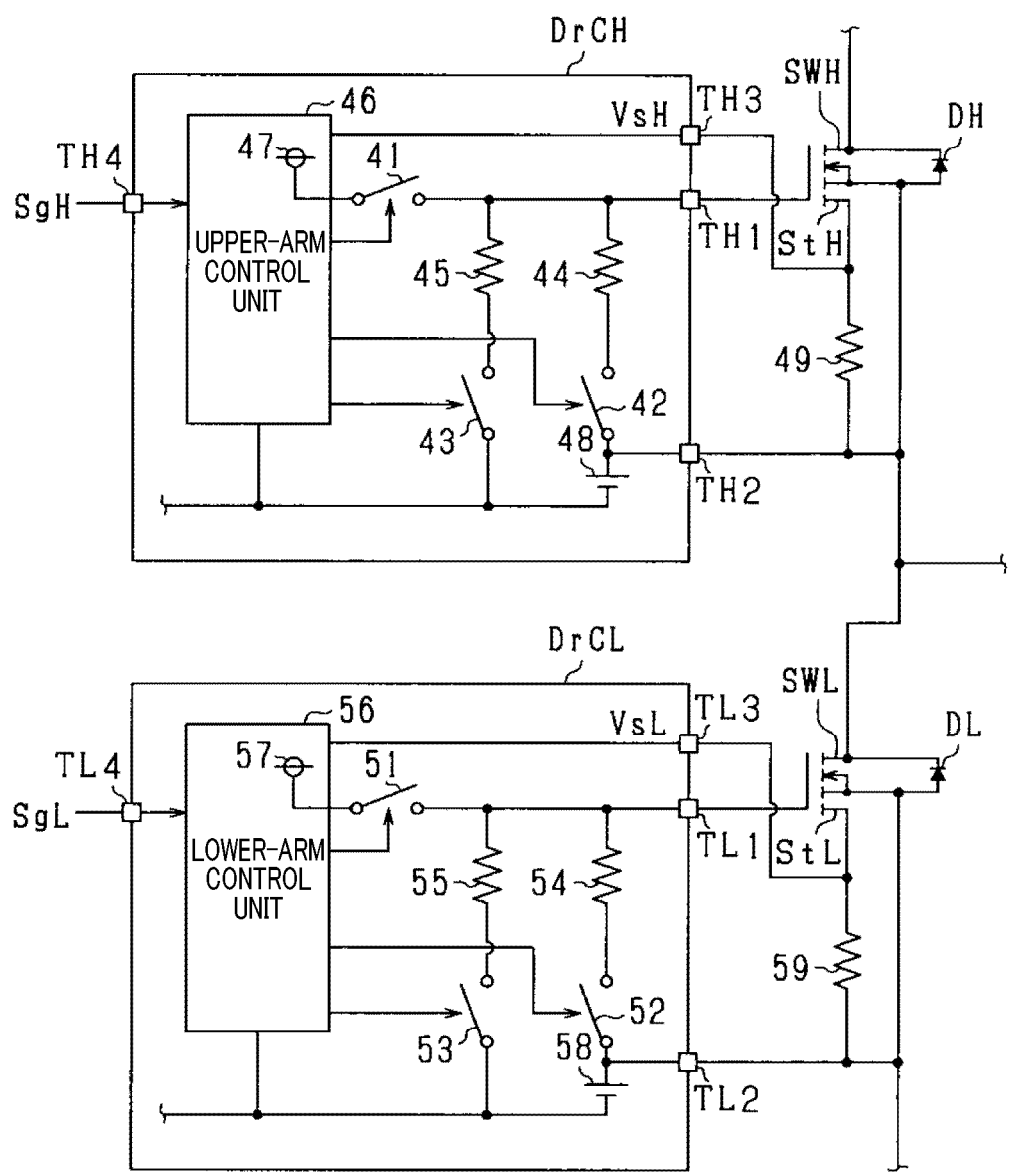
FIG. 2 is a diagram of a configuration of upper- and lower-arm drive circuits.

Next, the drive circuits DrCH and DrCL will be described with reference to FIG. 2.

First, the upper-arm drive circuit DrCH will be described. The upper-arm drive circuit DrCH includes an upper-arm charging switch 41, an upper-arm first switch 42, an upper-arm second switch 43, an upper-arm first resistor 44, an upper-arm second resistor 45, an upper-arm control unit 46, an upper-arm constant-voltage power supply 47, and an upper-arm negative power supply 48. A first upper-arm terminal TH1 of the upper-arm drive circuit DrCH is connected to the upper-arm constant-voltage power supply 47 through a charging resistor (not shown) and the upper-arm charging switch 41. The gate of the upper-arm switch SWH is connected to the first upper-arm terminal TH1.

A second upper-arm terminal TH2 of the upper-arm drive circuit DrCH is connected to the first upper-arm terminal TH1 through the upper-arm second resistor 44 and the upper-arm first switch 42. The source of the upper-arm switch SWH is connected to the second upper-arm terminal TH2. A positive terminal of the upper-arm negative power supply 48 is connected to the second upper-arm terminal TH2. A negative terminal of the upper-arm negative power supply 48 is connected to the first upper-arm terminal TH1 through the upper-arm second resistor 45 and the upper-arm second switch 43.

The upper-arm switch SWH includes an upper-arm sense terminal StH that outputs a minute current that is correlated with a drain current that flows to the upper-arm switch SWH itself. A first end of an upper-arm sense resistor 49 is connected to the upper-arm sense terminal StH. The second upper-arm terminal TH2 and the source of the upper-arm switch SWH are connected to a second end of the upper-arm sense resistor 49. A voltage decrease occurs in the upper-arm sense resistor 49 as a result of the minute current that is outputted from the upper-arm sense terminal StH.

According to the present embodiment, an electric potential on the first end side of the upper-arm sense resistor 49 relative to a source potential of the upper-arm switch SWH is referred to as an upper-arm sense voltage VsH. A third upper-arm terminal TH3 of the upper-arm drive circuit DrCH is connected to the first end of the upper-arm sense resistor 49. The upper-arm control unit 46 acquires the upper-arm sense voltage VsH through the third upper-arm terminal TH3.

Here, according to the present embodiment, the upper-arm sense voltage VsH when the source potential of the upper-arm switch SWH is zero and the potential on the first end side of the upper-arm sense resistor 49 is higher than the source voltage is defined as positive. In addition, according to the present embodiment, the upper-arm charging switch 41, the upper-arm first and second switches 42 and 43, the upper-arm first and second resistors 44 and 45, the upper-arm constant voltage power supply 47, and the upper-arm negative power supply 48 correspond to an upper-arm voltage adjusting unit.

The upper-arm control unit 46 acquires the upper-arm driving signal SgH that is outputted from the control apparatus 30, through a fourth upper-arm terminal TH4 of the upper-arm drive circuit DrCH. The upper-arm control unit 46 switches the upper-arm switch SWH to the on-state by a charging process when determined that the acquired upper-arm driving signal SgH is the on-command. The charging process is a process in which the upper-arm charging switch 41 is set to the on-state, and the upper-arm first switch 42 and the upper-arm second switch 43 is set to the off-state. In the charging process, a gate voltage VgsH of the upper-arm switch SWH becomes equal to or greater than a threshold voltage Vth.

As a result, the upper-arm switch SWH is switched from the off-state to the on-state. The threshold voltage Vth is a voltage that switches a switch from one state to the other state, of the on-state and the off-state. The upper-arm control unit 46 switches the upper-arm switch SWH to the off-state by a discharge process when determined that the upper-arm driving signal SgH is the off-command. The discharge process is a process in which the upper-arm charging switch 41 is set to the off-state, and either of the upper-arm first and second switches 42 and 43 is set to the on-state and the other is set to the off-state. In the discharge process, the gate voltage VgsH of the upper-arm switch SWH becomes less than the threshold voltage Vth. As a result, the upper-arm switch SWH is switched from the on-state to the off-state.

Next, the lower-arm drive circuit DrCL will be described. The lower-arm drive circuit DrCL includes a lower-arm charging switch 51, a lower-arm first switch 52, a lower-arm second switch 53, a lower-arm first resistor 54, a lower-arm second resistor 55, a lower-arm control unit 56, a lower-arm constant-voltage power supply 57, and a lower-arm negative power supply 58. In addition, the lower-arm drive circuit DrCL includes first to fourth lower-arm terminals TL1 to TL4.

According to the present embodiment, the configuration of the lower-arm drive circuit DrCL is basically similar to the configuration of the upper-arm drive circuit DrCH. Therefore, a detailed description of the lower-arm drive circuit DrCL is omitted. Here, according to the present embodiment, the lower-arm charging switch 51, the lower-arm first and second switches 52 and 53, the lower-arm first and second resistors 54 and 55, the lower-arm constant-voltage power supply 57, and the lower-arm negative power supply 58 correspond to a lower-arm voltage adjusting unit.

The lower-arm switch SWL includes a lower-arm sense terminal StL that outputs a minute current that is correlated with a drain current that flows to the lower-arm switch SWL itself. A first end of a lower-arm sense resistor 59 is connected to the lower-arm sense terminal StL. A second lower-arm terminal TL2 and the source of the lower-arm switch SWL are connected to a second terminal of the lower-arm sense resistor 59. According to the present embodiment, a potential on the first end side of the lower-arm sense resistor 59 relative to a source potential of the lower-arm switch SWL is referred to as a lower-arm sense voltage VsL. A third lower-arm terminal TL3 is connected to the first end of the lower-arm sense resistor 59. The lower-arm control unit 56 acquires the lower-arm sense voltage VsL through a third lower-arm terminal TL3.

Figure 3:
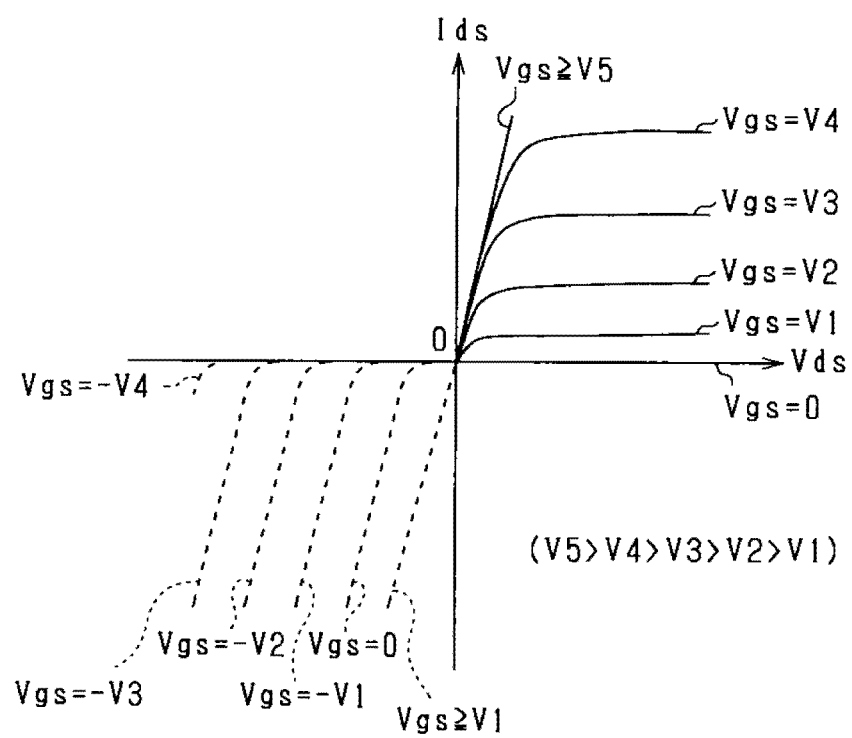
FIG. 3 is a diagram of characteristics of upper- and lower-arm switches.

Next, characteristics of the upper- and lower-arm switches SWH and SWL according to the present embodiment will be described with reference to FIG. 3. Here, in the description below, a gate-source voltage Vgs of a switch is defined as positive when the gate potential is higher than the source potential. In addition, a drain current Ids is defined as positive when flowing from the drain side to the source side.

When the gate-source voltage Vgs is higher than 0, the flow of the drain current Ids is allowed both from the drain side to the source side and from the source side to the drain side. In this case, the flow of current is also possible to the body diode of the switch from the source side towards the drain side. Meanwhile, when the gate-source voltage Vgs is less than 0, the drain current Ids only flows in a negative direction.

That is, when the gate-source voltage Vgs is less than 0, the current flows only to the body diode from the source side towards the drain side. When the gate-source voltage Vgs is less than 0, the drain-source voltage Vds that is generated when a certain drain current Ids flows increases as an absolute value of the gate-source Vgs increases. That is, when the gate-source voltage Vgs is less than 0, conduction loss that occurs in the body diode when a certain drain current Ids flows increases as the absolute value of the gate-source Vgs increases.

Next, self turn-on in which a switch is erroneously switched to the on-state will be described. The upper- and lower-arm switches SWH and SWL have feedback capacitance that is formed between each of the drain and the gate, and the source and the gate. For example, as a result of the feedback capacitance being present, self turn-on of the lower-arm switch SWL may occur regardless of a desire to keep the lower-arm switch SWL in the off-state. Therefore, according to the present embodiment, a process to maintain the gate voltage at a negative voltage that is less than 0 is performed. This process will be described below with reference to FIG. 4 to FIG. 6.

Figure 4:
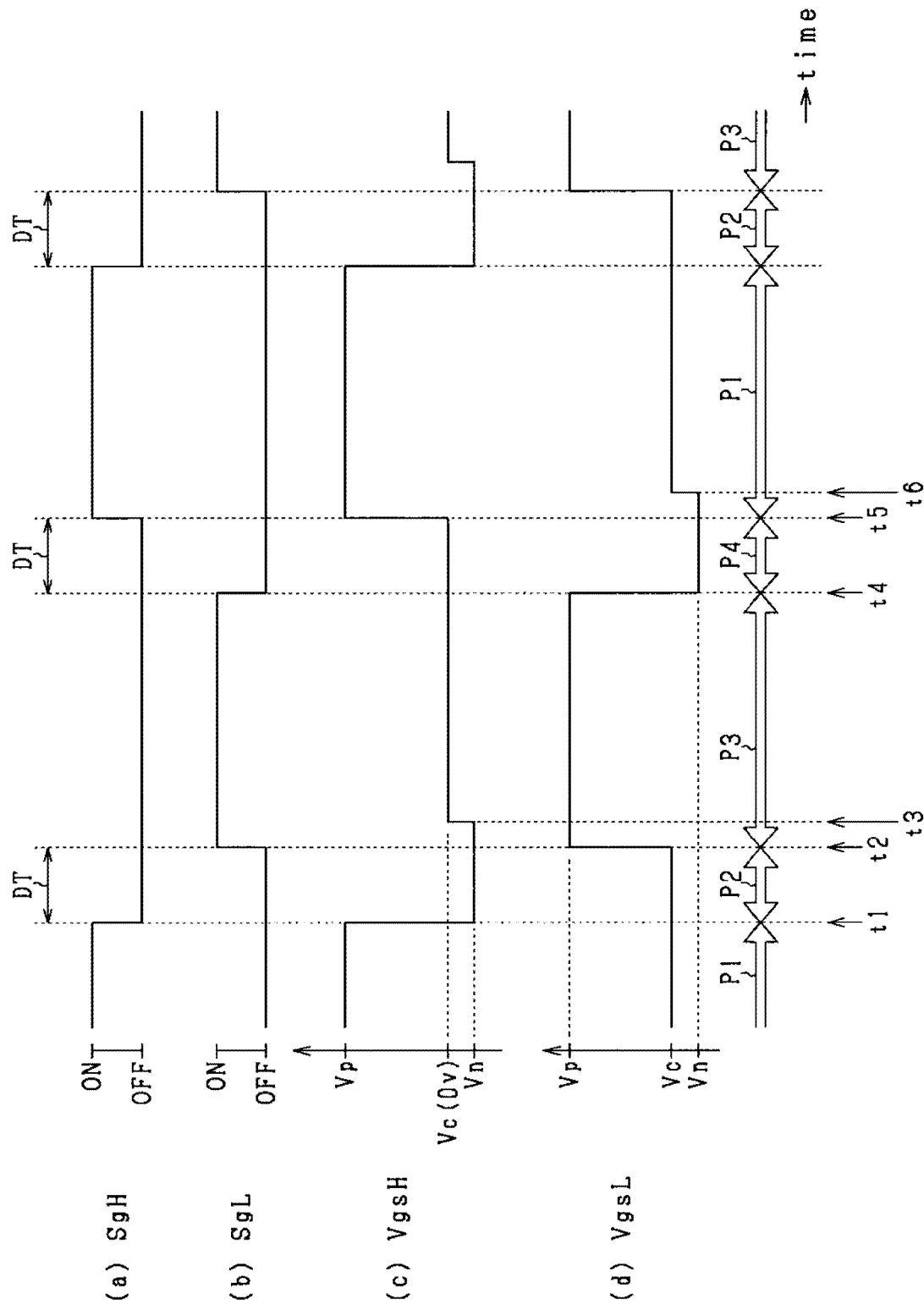
FIG. 4 is a time chart of transitions in gate voltages of the upper- and lower-arm switches.

FIG. 4 shows, by (a), transitions in the upper-arm driving signal SgH. FIG. 4 shows, by (b), transitions in the lower-arm driving signal SgL. FIG. 4 shows, by (c), transitions in the gate voltage VgsH of the upper-arm switch SWH. FIG. 4 shows, by (d), transitions in the gate voltage VgsL of the lower-arm switch SWL.

In FIG. 4, Vp denotes an on-voltage that is the gate voltage when the upper-arm charging switch 41 is in the on-state, and the upper-arm first and second switches 42 and 43 are in the off-state.

According to the present embodiment, the on-voltage Vp is a voltage (such as 20 V) that is higher than the threshold voltage Vth. Vc denotes an off-voltage that is the gate voltage when the upper-arm charging switch 41 and the upper-arm second switch 43 are in the off-state, and the upper-arm first switch 42 is in the on-state. The off-voltage Vc is a voltage that is lower than the threshold voltage Vth and is 0 V according to the present embodiment. Vn denotes a negative voltage that is the gate voltage when the upper-arm charging switch 41 and the upper-arm first switch 42 are in the off-state and the upper-arm second switch 43 is in the on-state. The negative voltage Vn is a voltage (such as −5 V) that is lower than 0.

A case in which a flow direction of the phase current is a positive direction will be described with reference to FIG. 4 and FIG. 5. According to the present embodiment, the phase voltage that flows in a direction from the connection point of the upper- and lower-arm switches SWH and SWL towards the winding 11 is defined as a positive direction. According to the present embodiment, when the flow direction of the phase current is the positive direction, the lower-arm diode DL corresponds to a target diode, the lower-arm switch SWL corresponds to a target switch, and the upper-arm switch SWH corresponds to an opposing arm switch.

As shown in FIG. 5 by (a), in a first period P1, the upper-arm switch SWH is in the on-state and the lower-arm switch SWL is in the off-state. As a result, the current flows from the drain side of the upper-arm switch SWH to the winding 11, through the source.

A second period P2 that is indicated by time t1 to t2 is a dead time DT. According to the present embodiment, the dead time DT is a period during which the upper- and lower-arm switches SWH and SWL are both in the off-state. Therefore, as shown in FIG. 5 by (b), in the second period P2, the upper- and lower-arm switches SWH and SWL are both in the off-state. In this case, a feedback current flows to the winding 11 through the lower-arm diode DL. In the second period P2, the gate voltage VgsL of the lower-arm switch is the off-voltage Vc (0 V). Therefore, compared to when the gate voltage VgsL is the negative voltage Vn, conduction loss caused by the feedback current flowing to the lower-arm diode DL during the dead time DT can be reduced.

As shown in FIG. 5 by (c), in a third period P3 that is indicated by time t2 to t4, the upper-arm switch SWH is set to the off-state and the lower-arm switch SWL is set to the on-state. As a result, the feedback current flows from the source side of the lower-arm switch SWL to the winding 11, through the drain.

A fourth period P4 that is indicated at time t4 to t5 is the dead time DT. As shown in FIG. 5 by (d), in the fourth period P4, the upper- and lower-arm switches SWH and SWL are both in the off-state. As a result, the feedback current flows to the winding 1 through the lower-arm diode DL. The gate voltage VgsL of the lower-arm switch SWL is maintained at the negative voltage Vn over a period from a start timing t4 of the fourth period P4 to a timing t6 that is after an end timing t5 of the fourth period P4.

Therefore, self turn-on occurring in the lower-arm switch SWL in accompaniment with the upper-arm switch SWH being switched to the on-state at time t5 can be suppressed. Furthermore, the gate voltage VgsL of the lower-arm switch SWL can be maintained at the off-voltage Vc instead of the negative voltage Vn over a period from the timing t6 until a next dead time is ended. As a result, a period over which the gate voltage VgsL is maintained at the negative voltage Vn can be shortened, and progression of deterioration of the lower-arm switch SWL can be suppressed.

A case in which the flow direction of the phase current is a negative direction will be described with reference to FIG. 4 and FIG. 6. According to the present embodiment, when the flow direction of the phase current is the negative direction, the upper-arm diode DH corresponds to the target diode, the upper-arm switch SWH corresponds to the target switch, and the lower-arm switch SWL corresponds to the opposing arm switch.

As shown in FIG. 6 by (a), in the third period P3, the upper-arm switch SWH is set to the on-state and the lower-arm switch SWL is set to the off-state. As a result, the current flows from the winding 11 to the source side of the upper-arm switch SWH, through the drain.

The subsequent fourth period P4 is the dead time DT. As shown in FIG. 6 by (b), in the fourth period P4, the upper- and lower-arm switches SWH and SWL are both turned off. As a result, the feedback current flows from the winding 11 through the upper-arm diode DH. In the fourth period P4, the gate voltage VgsH of the upper-arm switch SWH is the off-voltage Vc (0 V). Therefore, conduction loss caused by the feedback current flowing to the upper-arm diode DH during the dead time DT can be reduced.

As shown in FIG. 6 by (c), in the first period P1, the upper-arm switch SWH is in the on-state and the lower-arm switch SWL is in the off-state. As a result, the feedback current flows from the winding 11 to the drain side of the upper-arm switch SWH, through the source.

The second period P2 is the dead time DT. As shown in FIG. 6 by (d), in the second period P2, the upper- and lower-arm switches SWH and SWL are both in the off-state. As a result, the feedback current flows from the winding 11 through the upper-arm diode DH. The gate voltage VgsH of the upper-arm switch SWH is at the negative voltage Vn over a period from a start timing t1 of the second period P2 to a timing t3 after an end timing t2 of the second period P2.

Therefore, self turn-on of the upper-arm switch SWH occurring in accompaniment with the lower-arm switch SWL being switched to the on-state at time t2 can be suppressed. Furthermore, the gate voltage VgsH of the upper-arm switch SWH can be maintained at the off-voltage instead of the negative voltage Vn over a period from the timing t3 until a next dead time is ended. As a result, a period over which the gate voltage VgsH is maintained at the negative voltage Vn can be shortened, and progression of deterioration of the upper-arm switch SWH can be suppressed.

Figure 7:
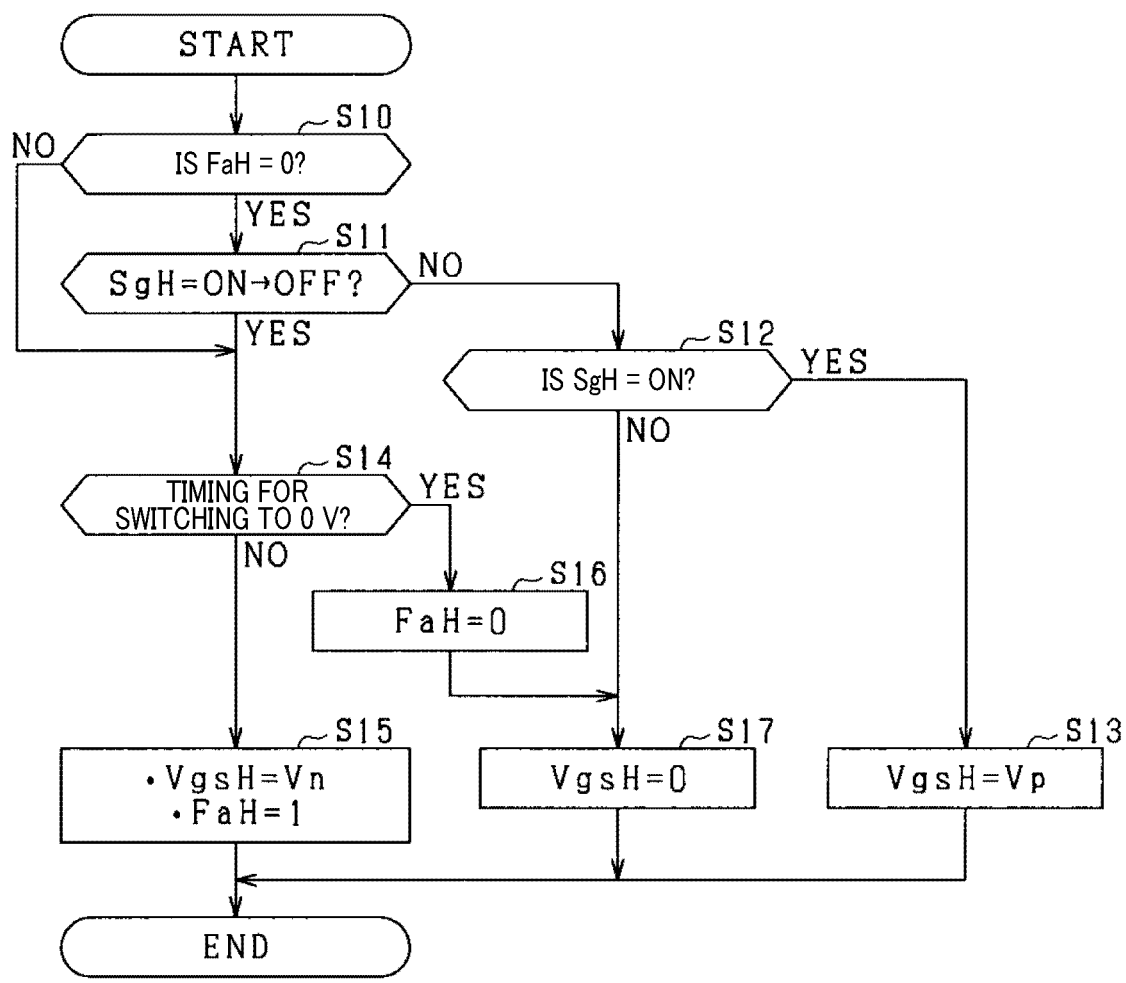
FIG. 7 is a flowchart of the steps in a driving process of the upper-arm switch.

FIG. 7 shows the steps in a driving process of the upper-arm switch SWH performed by the upper-arm control unit 46. For example, this process is repeatedly performed at each predetermined processing cycle.

At step S10, the upper-arm control unit 46 determines whether an upper-arm holding flag FaH is 1. The upper-arm holding flag FaH indicates, with a value of 1, holding of the gate voltage VgsH at the negative voltage Vn, and indicates, with a value of 0, that the gate voltage VgsH is not being held at the negative voltage Vn. According to the present embodiment, an initial value of the upper-arm holding flag FaH is set to 0.

At step S11, the upper-arm control unit 46 determines whether the upper-arm driving signal SgH is to be switched from the on-command to the off-command at the current processing cycle, based on the acquired upper-arm driving signal SgH.

When the determination result is YES at step S11, the upper-arm control unit 46 proceeds to step S12 and determines whether the upper-arm driving signal SgH is the on-command. When the determination result is YES at step S12, the upper-arm control unit 46 proceeds to step S13, and sets the upper-arm charging switch 41 to the on-state, and the upper-arm first and second switches 42 and 43 to the off-state. As a result, the gate voltage VgsH is set to the on-voltage Vp.

When determined that the upper-arm driving signal SgH is switched from the on-command to the off-command at step S11, the upper-arm control unit 46 proceeds to step S14. At step S14, the upper-arm control unit 46 determines whether the timing is a timing at which the gate voltage VgsH is switched to the off-voltage Vc (0 V). The timing at which the gate voltage VgsH is switched to the off-voltage Vc is a timing after the lower-arm switch SWL is switched to the on-state, and a timing at which self turn-on of the upper-arm switch SWH does not occur.

For example, at step S14, the upper-arm control unit 46 counts elapsed time from when the upper-arm control unit 46 determines YES at step S11 by a clocking unit such as a timer that is provided in the upper-arm drive circuit DrCH. When determined that the counted elapsed time has reached a first predetermined amount of time, the upper-arm control unit 46 may determine YES at step S14.

When the determination result is NO at step S14, the upper-arm control unit 46 proceeds to step S15, and sets the upper-arm charging switch 41 and the upper-arm first switch 42 to the off-state, and the upper-arm second switch 43 to the on-state. As a result, the gate voltage VgsH is set to the negative voltage Vn. In addition, the upper-arm holding flag FaH is set to 1.

When the determination result is YES at step S14, the upper-arm control unit 46 proceeds to step S16 and sets the upper-arm holding flag FaH to 0. Then, the upper-arm control unit 46 proceeds to step S17, and switches the upper-arm second switch 43 to the off-state and the upper-arm first switch 42 to the on-state. As a result, the gate voltage VgsH is set to the off voltage Vc (0 V). Here, the upper-arm control unit 46 proceeds to step S17 when determined that the upper-arm driving signal SgH is the off-command at step S12, as well.

Figure 8:
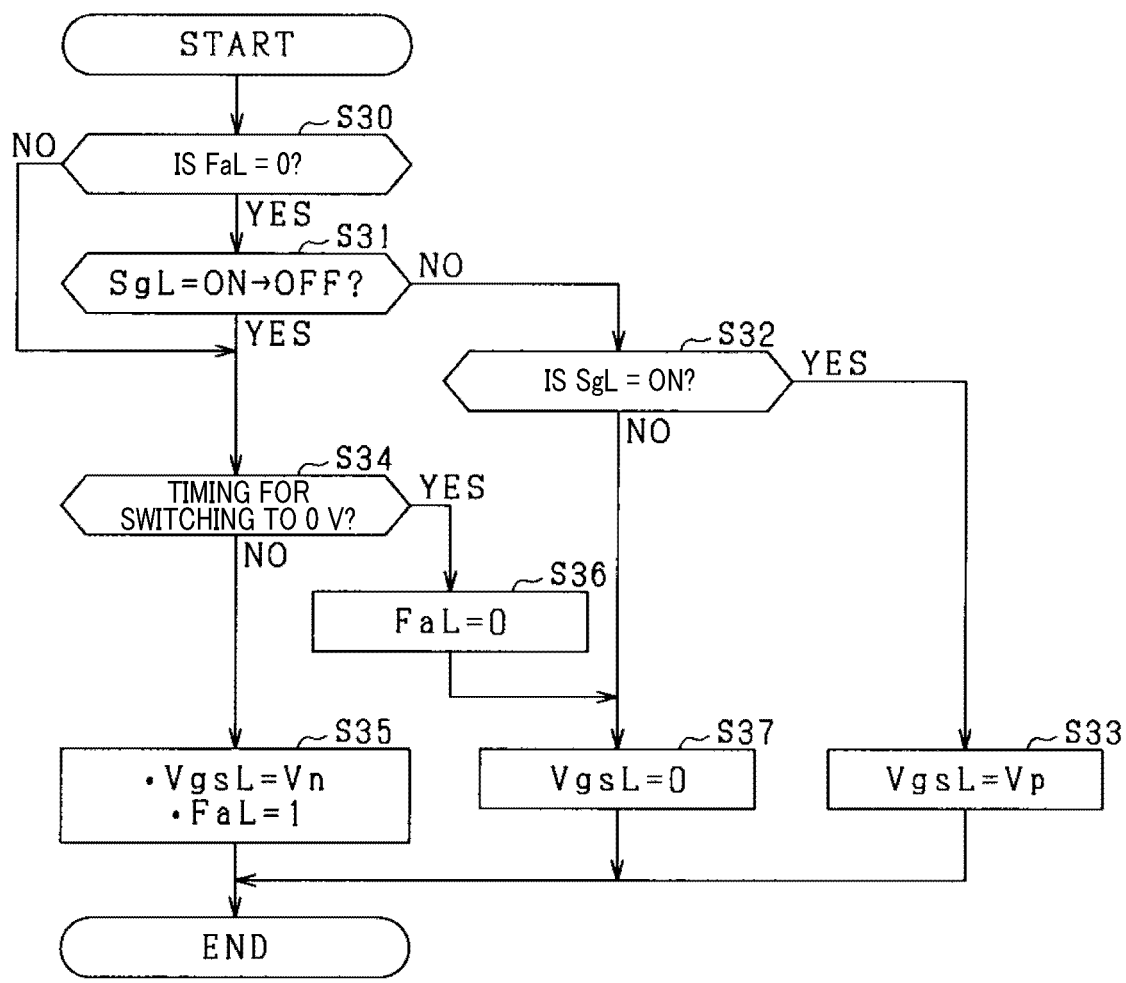
FIG. 8 is a flowchart of the steps in a driving process of the lower-arm switch.

FIG. 8 shows the steps in a driving process of the lower-arm switch SWL performed by the lower-arm control unit 56. For example, this process is repeatedly performed at each predetermined processing cycle.

At step S30, the lower-arm control unit 56 determines whether a lower-arm holding flag FaL is 1. The lower-arm holding flag FaL indicates, with a value of 1, holding of the gate voltage VgsL at a negative voltage Vn, and indicates, with a value of 0, that the gate voltage VgsL is not being held at the negative voltage Vn. According to the present embodiment, an initial value of the lower-arm holding flag FaL is 0.

At step S31, the lower-arm control unit 56 determines whether the lower-arm driving signal SgL is switched from the on-command to the off-command at the current processing cycle, based on the acquired lower-arm driving signal SgL.

When the determination result is YES at step S31, the lower-arm control unit 556 proceeds to step S32 and determines whether the lower-arm driving signal SgL is the on-command. When the determination result is YES at step S32, the lower-arm control unit 56 proceeds to step S33, and sets the lower-arm charging switch 51 to the on-state, and the lower-arm first and second switches 52 and 53 to the off-state. As a result, the gate voltage VgsL is set to the on-voltage Vp.

When the determination result is YES at step S31, the lower-arm control unit 56 proceeds to step S34 and determines whether the timing is a timing at which the gate voltage VgsL is switched to the off-voltage Vc (0 V). The timing at which the gate voltage VgsL is switched to the off-voltage Vc is a timing after the upper-arm switch SWH is switched to the on-state, and a timing at which the self turn-on of the lower-arm switch SWL does not occur.

For example, at step 34, the lower-arm control unit 56 counts elapsed time from when the lower-arm control unit 56 determines YES at step S31 by a clocking unit such as a timer that is provided in the lower-arm drive circuit DrCL. When determined that the counted elapsed time has reached a second predetermined amount of time, the lower-arm control unit 56 may determine YES at step S34. Here, the second predetermined amount of time may be the same amount of time as the first predetermined amount of time at step S14, above, or may be a differing amount of time.

When the determination result is NO at step S34, the lower-arm control unit 56 proceeds to step S35, and sets the lower-arm charging switch 51 and the lower-arm first switch 52 to the off-state, and the lower-arm second switch 53 to the on state. As a result, the gate voltage VgsL is set to the negative voltage Vn. In addition, the lower-arm holding flag FaL is set to 1.

When the determination result is YES at step S34, the lower-arm control unit 56 proceeds to step S36 and sets the lower-arm holding flag FaL to 0. Then, the lower-arm control unit 56 proceeds to step S37, and switches the lower-arm second switch 53 to the off-state and the lower-arm first switch 52 to the on-state. As a result, the gate voltage VgsL is set to the off-voltage Vc (0 V). Here, even when the determination result is NO at step S32, the lower-arm control unit 56 proceeds to step S37.

According to the present embodiment described in detail above, in configuring the inverter 20, the period over which the negative voltage Vn is maintained can be shorted while occurrence of self turn-on of the upper- and lower-arm switches SWH and SWL is suppressed. As a result, progression of deterioration of the upper- and lower-arm switches SWH and SWL can be suppressed.

Second Embodiment

Figure 9:
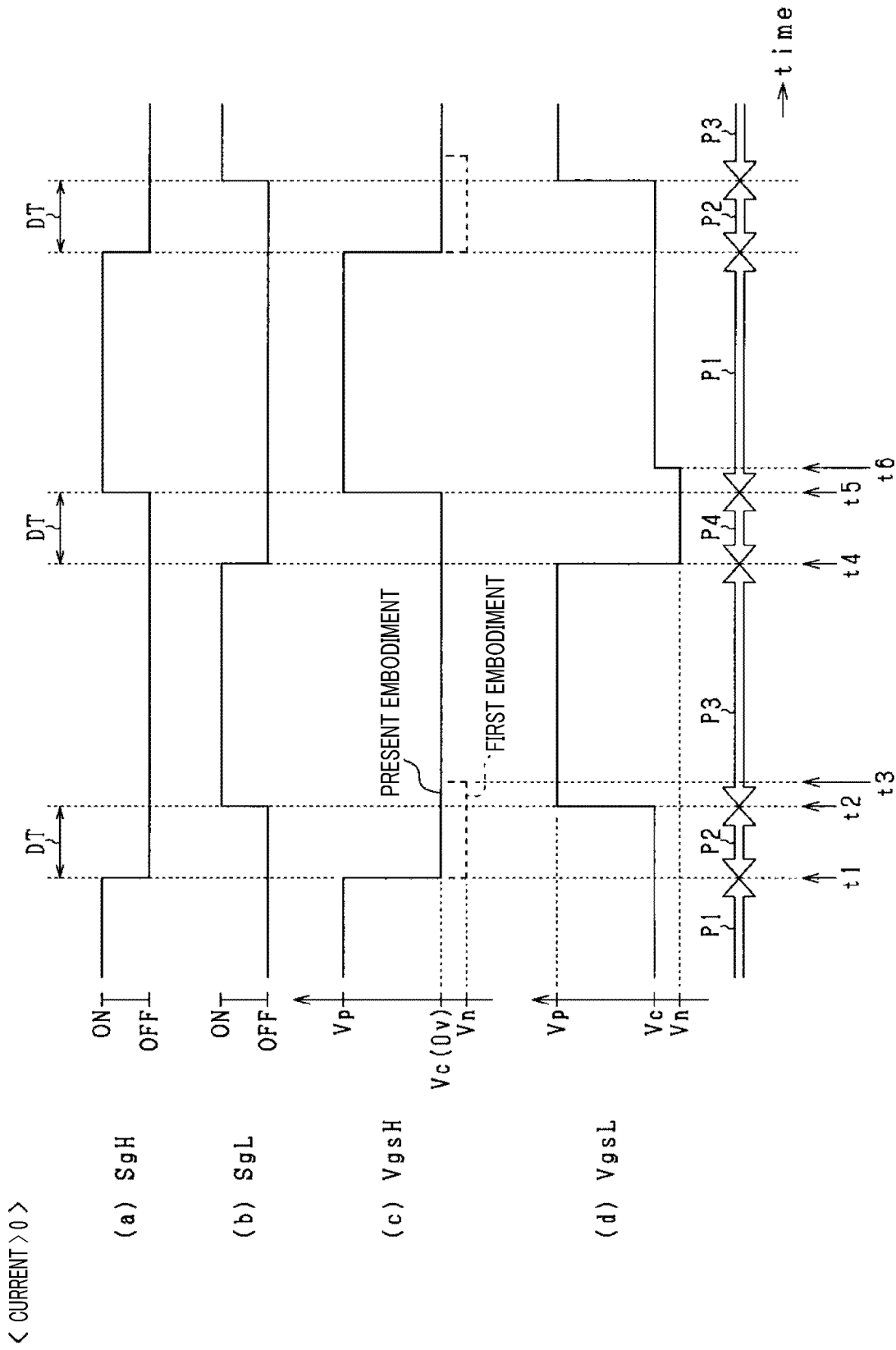
FIG. 9 is a time chart of transitions in gate voltages of upper- and lower-arm switches when a phase current is positive according to a second embodiment.

A second embodiment will be described below with reference to the drawings, mainly focusing on differences with the first embodiment. According to the present embodiment, when the flow direction of the phase current is positive, as shown in FIG. 9, at each of the dead time DT and the period during which the lower-arm switch SWL is in the on-state, the gate voltage VgsH of the upper-arm switch SWH is at the off-voltage Vc.

Figure 10:
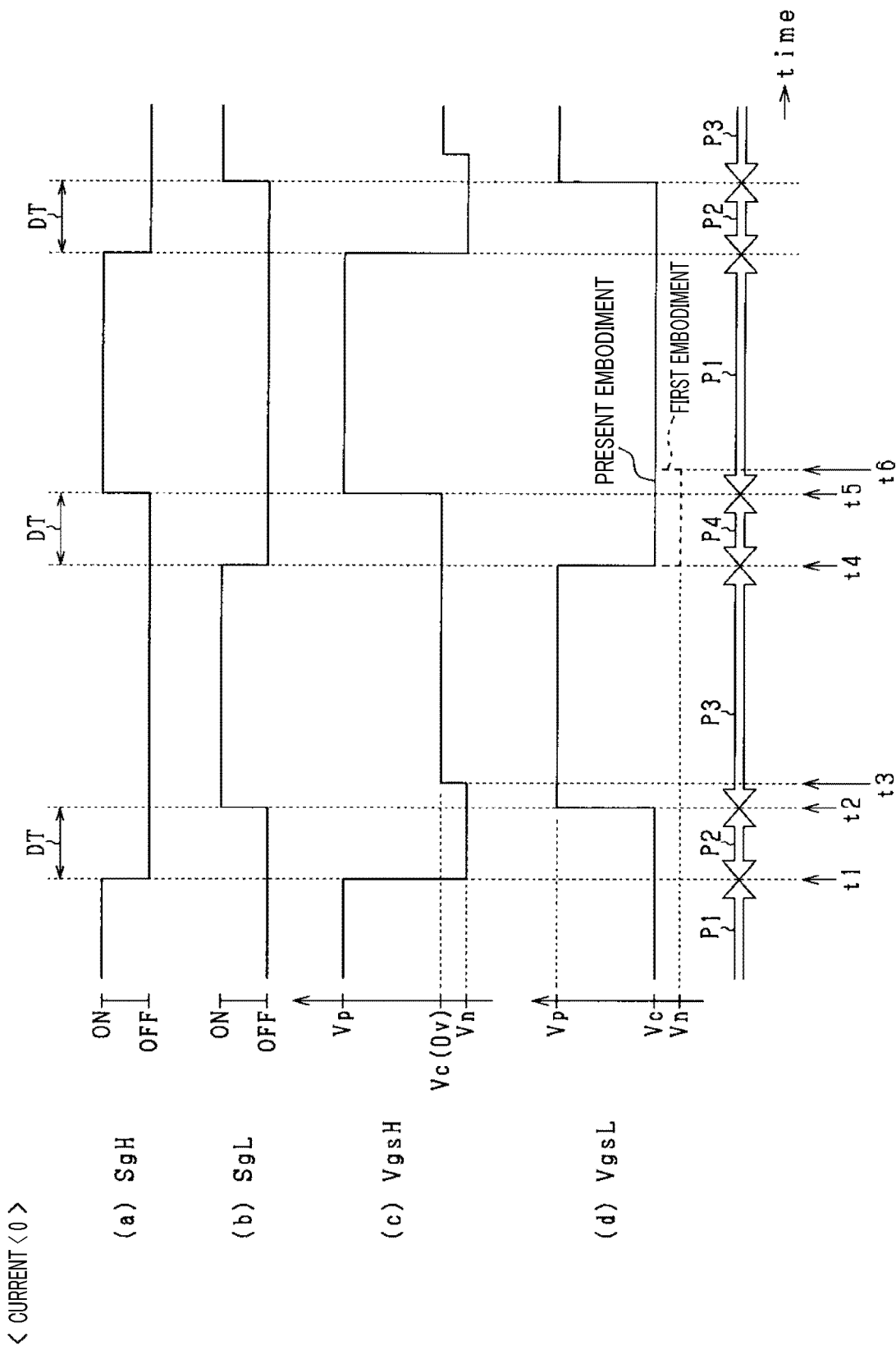
FIG. 10 is a time chart of transitions in the gate voltages of the upper- and lower-arm switches when the phase current is negative.

That is, when the flow direction of the phase current is positive, the gate voltage VgsH of the upper-arm switch SWH is not at the negative voltage Vn. Meanwhile, when the flow direction of the phase current is negative, as shown in FIG. 10, at each of the dead time DT and the period during which the upper-arm switch SWH is set to the on-state, the gate voltage VgsL of the lower-arm switch SWL is at the off-voltage Vc. That is, when the flow direction of the phase current is negative, the gate voltage VgsL of the lower-arm switch SWL is not at the negative voltage Vn.

The above-described configuration has been achieved in light of the state in which self turn-on may occur changing based on the flow direction of the phase current. The above-described configuration is to further suppress progression in deterioration of the upper- and lower-arm switches SWH and SWL. Here, FIG. 9 and FIG. 10 correspond to FIG. 4, above.

Figure 11:
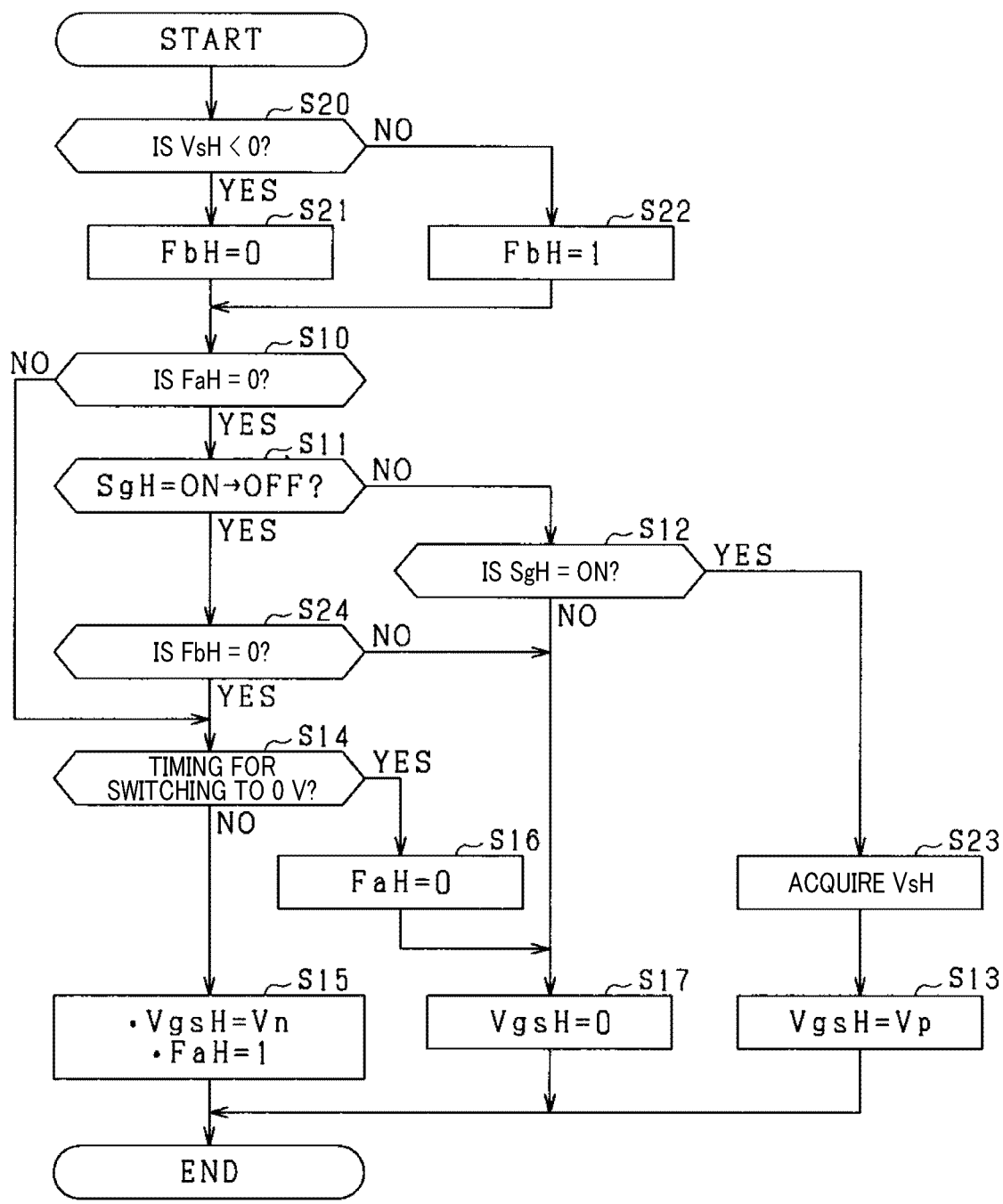
FIG. 11 is a flowchart of the steps in a driving process of the upper-arm switch.

FIG. 11 shows the steps in the driving process of the upper-arm switch SWH performed by the upper-arm control unit 46. For example, this process is repeatedly performed at each predetermined processing cycle. Here, processes in FIG. 11 that are identical to the processes shown in FIG. 7, above, are given the same reference numbers for convenience.

At step S20, the upper-arm control unit 46 determines whether the upper-arm sense voltage VsH acquired at step S23, described hereafter, is a negative value. The upper-arm sense voltage VsH acquired at step S23 is the upper-arm sense voltage VsH that is recently acquired during the period in which the upper-arm driving signal SgH is the on-command.

When determined that the upper-arm sense voltage VsH is a negative value at step S20, the upper-arm control unit 46 proceeds to step S21 and sets an upper-arm determination flag FbH to 0. The upper-arm determination flag FbH indicates, with a value of 0, that the flow direction of the phase current is the negative direction, and indicates, with a value of 1, that the flow direction of the phase current is the positive direction. According to the present embodiment, an initial value of the upper-arm determination flag FbH is 0.

When determined that the upper-arm sense voltage VsH is equal to or greater than 0 at step S20, the upper-arm control unit 46 proceeds to step S22 and sets the upper-arm determination flag FbH to 1. After completing the process at step S21 or S22, the upper-arm control unit 46 proceeds to step S10.

When the determination result is NO at step S11 and determined YES at step S12, the upper-arm control unit 46 proceeds to step S23. At step S23, the upper-arm control unit 46 acquires the upper-arm sense voltage VsH.

When the determination result is YES at step S11, the upper-arm control unit 46 proceeds to step S24 and determines whether the upper-arm determination flag FbH is 0. When determined that the upper-arm determination flag FbH is 0, the upper-arm control unit 46 proceeds to step S14. Meanwhile, when determined that the upper-arm determination flag FbH is 1, the upper-arm control unit 46 proceeds to step S17. Therefore, the gate voltage VgsH is not at the negative voltage Vn when the upper-arm driving signal SgH is the off-command.

Figure 12:
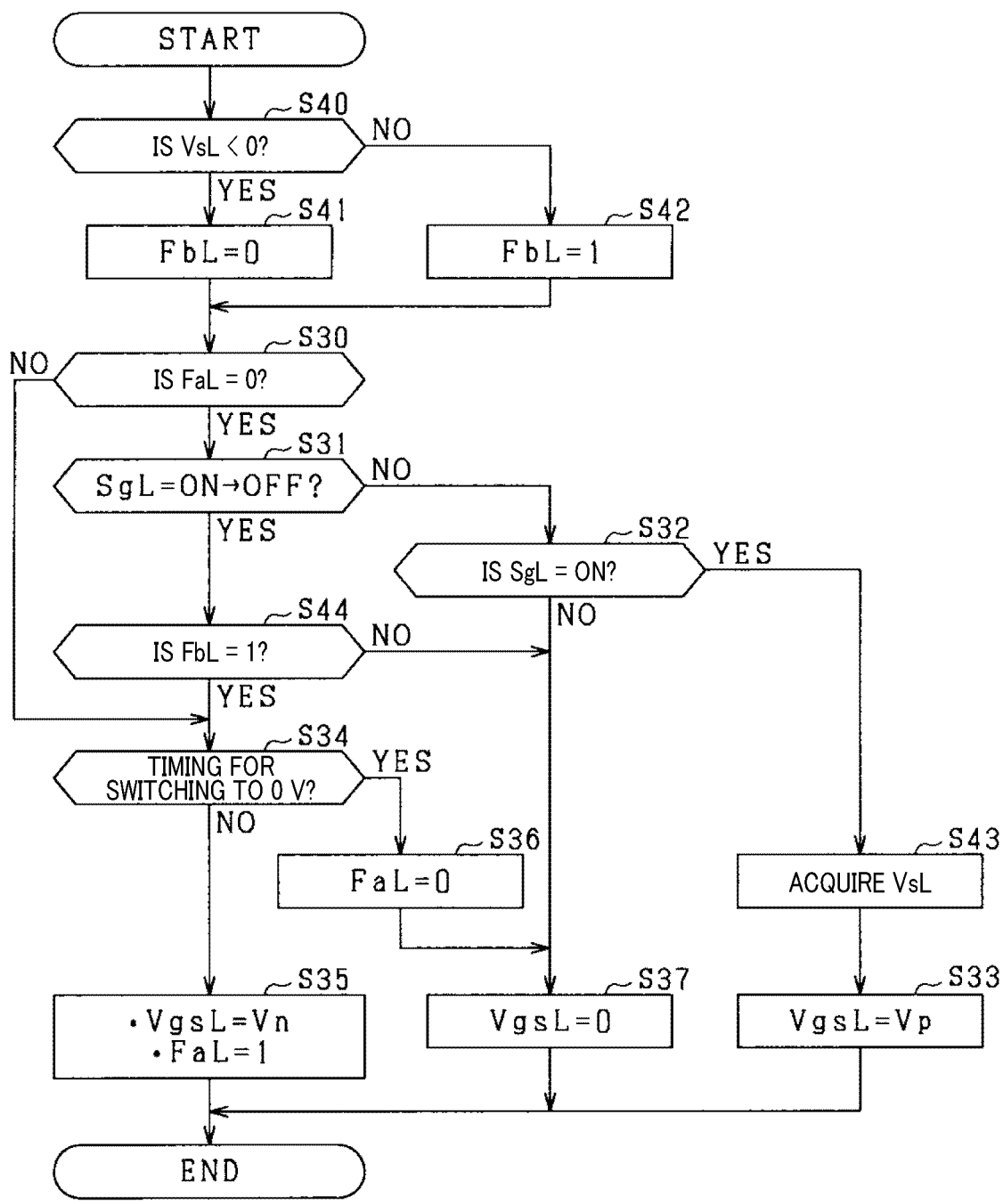
FIG. 12 is a flowchart of the steps in a driving process of the lower-arm switch.

FIG. 12 shows the steps in the driving process of the lower-arm switch SWL performed by the lower-arm control unit 56. For example, this process is repeatedly performed at each predetermined processing cycle. Here, processes in FIG. 12 that are identical to the processes shown in FIG. 8, above, are given the same reference numbers for convenience.

At step S40, the lower-arm control unit 56 determines whether the lower-arm sense voltage VsL acquired at step S43, described hereafter, is a negative value.

When determined that the lower-arm sense voltage VsL is a negative value at step S40, the lower-arm control unit 56 proceeds to step S41 and sets a lower-arm determination flag FbL to 0. The lower-arm determination flag FbL indicates, with a value of 0, that the flow direction of the phase current is the negative direction, and indicates, with a value of 1, that the flow direction of the phase current is the positive direction. According to the present embodiment, an initial value of the upper-arm determination flag FbL is 0.

When the determination result is YES at step S40, the lower-arm control unit 56 proceeds to step S42 and sets the lower-arm determination flag FbL to 1. After completing the process at step S41 or S42, the lower-arm control unit 56 proceeds to step S30.

When the determination result is NO at step S31 and determined YES at step S32, the lower-arm control unit 56 proceeds to step S43. At step S43, the lower-arm control unit 56 acquires the lower-arm sense voltage VsL.

When the determination result is YES at step S31, the lower-arm control unit 56 proceeds to step S44 and determines whether the lower-arm determination flag FbL is 0. When determined that the lower-arm determination flag FbL is 1, the lower-arm control unit 56 proceeds to step S34. Meanwhile, when determined that the lower-arm determination flag FbL is 0, the lower-arm control unit 56 proceeds to step S37. Therefore, the gate voltage VgsL is not at the negative voltage Vn when the lower-arm driving signal SgL is the off-command.

According to the present embodiment described above, the period over which the negative voltage Vn is maintained can be further shortened, and progression of deterioration of the upper- and lower-arm switches SWH and SWL can be further suppressed.

Third Embodiment

A third embodiment will be described below with reference to the drawings, mainly focusing on differences with the second embodiment. According to the present embodiment, the flow direction of the phase current is determined based on a detection value of the phase current detecting unit 23 instead of the sense voltage. The detection value of the phase current detecting unit 23 is inputted to each of the drive circuits DrCH and DrCL through the control apparatus 30.

Figure 13:
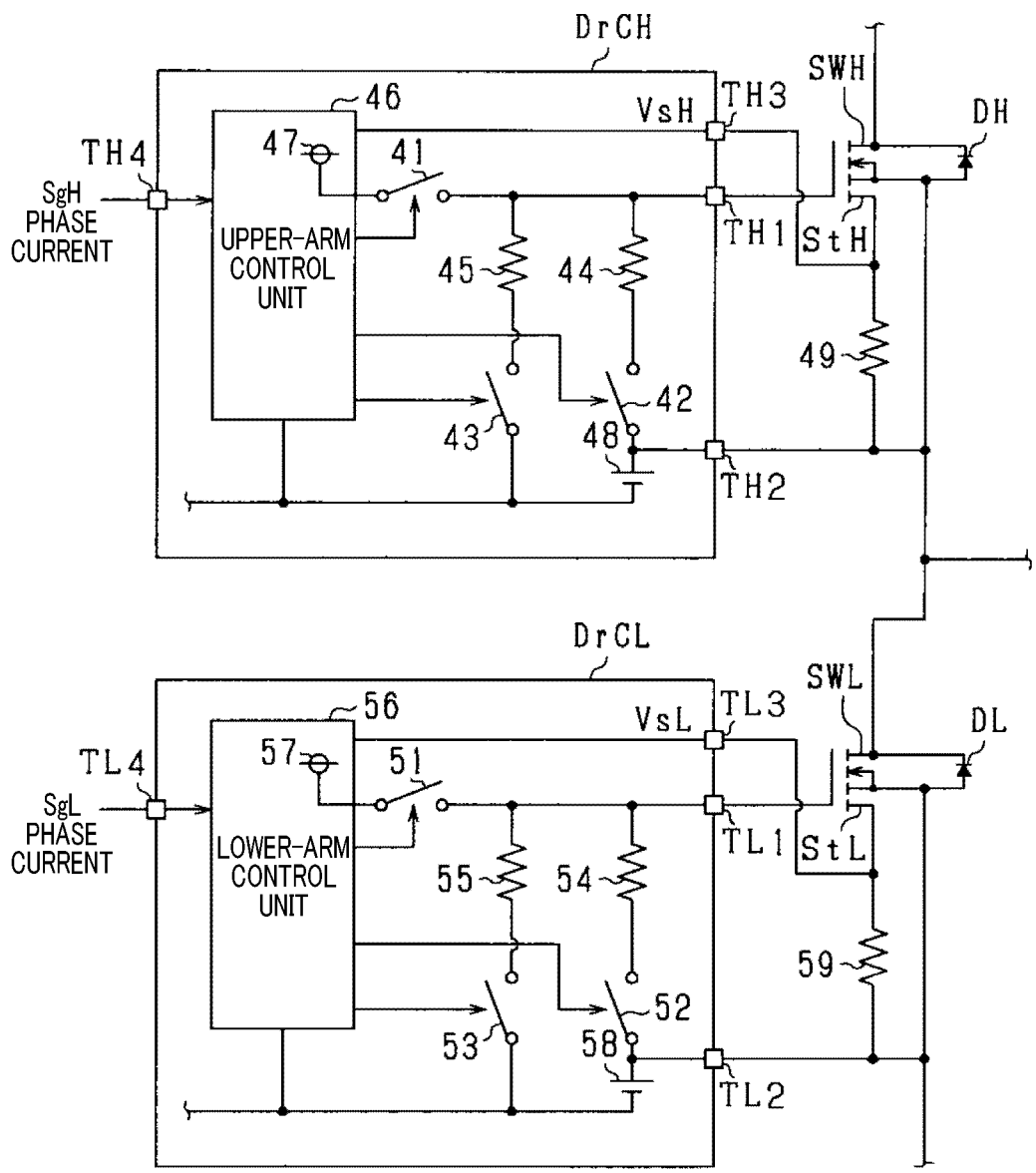
FIG. 13 is a diagram of a configuration of upper- and lower-arm drive circuits according to a third embodiment.

Specifically, as shown in FIG. 13, phase current information of the phase corresponding to the upper-arm control unit 46 itself is inputted to the upper-arm control unit 46 through the fourth upper-arm terminal TH4. In FIG. 13, configurations that are identical to the configurations shown in FIG. 2, above, are given the same reference numbers for convenience. Phase current information of the phase corresponding to the lower-arm control unit 56 itself is inputted to the lower-arm control unit 56 through the fourth lower-arm terminal TL1. Here, FIG. 13 shows a configuration in which the phase current information is inputted through the fourth upper- and lower-arm terminals TH4 and TL4. However, the configuration is not limited thereto. A configuration in which the phase current information is inputted through terminals other than the fourth upper- and lower-arm terminals TH4 and TL4 is also possible.

Figure 14:
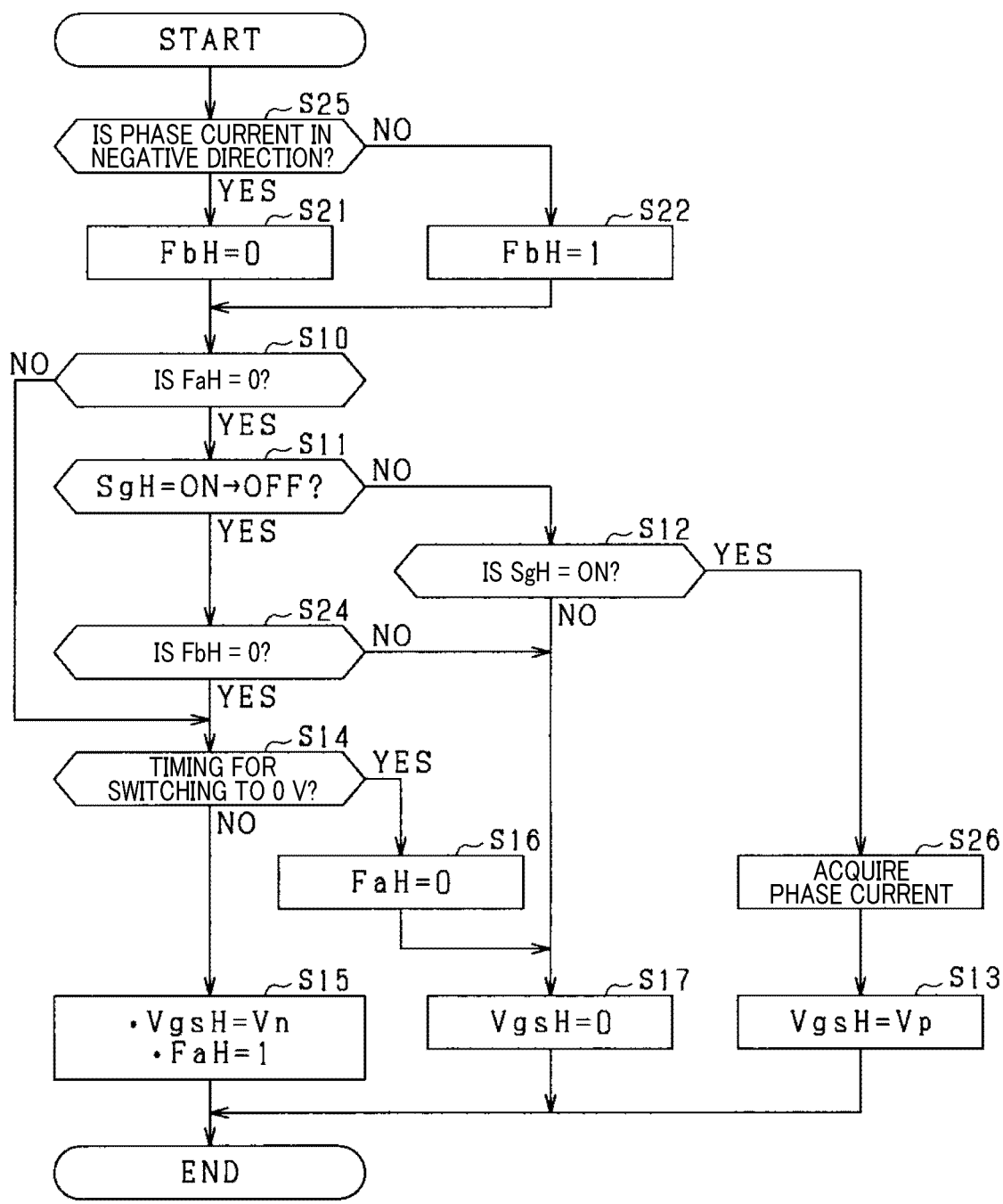
FIG. 14 is a flowchart of the steps in a driving process of the upper-arm switch.

FIG. 14 shows the steps in the driving process of the upper-arm switch SWH performed by the upper-arm control unit 46. For example, this process is repeatedly performed at each predetermined processing cycle. Here, processes in FIG. 14 that are identical to the processes shown in FIG. 11, above, are given the same reference numbers for convenience.

At step S25, the upper-arm control unit 46 determines whether the flow direction of the phase current is the negative direction based on the phase current acquired at step S26, described hereafter. The phase current acquired at step S26 is a phase current that is recently acquired during a period over which the upper-arm driving signal SgH is the on-command.

When determined that the flow direction of the phase current is the negative direction at step S25, the upper-arm control unit 46 proceeds to step S21. Meanwhile, when determined that the flow direction is the positive direction at step S25, the upper-arm control unit 46 proceeds to step S22. Here, when the determination result is YES at step S12, the upper-arm control unit 46 proceeds to step S26 and acquires the phase current.

Figure 15:
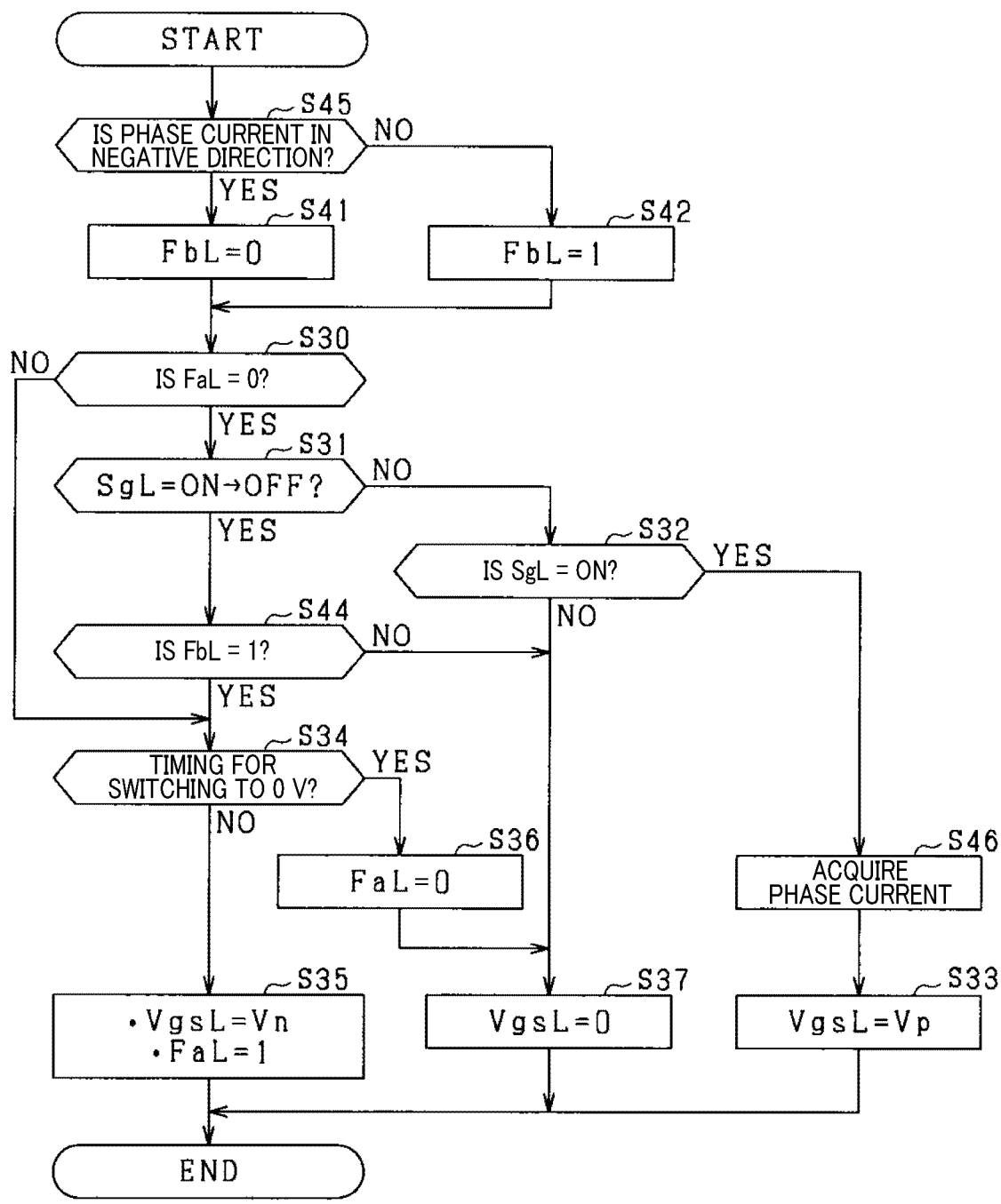
FIG. 15 is a flowchart of the steps in a driving process of the lower-arm switch.

FIG. 15 shows the steps in the driving process of the lower-arm switch SWL performed by the lower-arm control unit 56. For example, this process is repeatedly performed at each predetermined processing cycle. Here, processes in FIG. 15 that are identical to the processes shown in FIG. 12, above, are given the same reference numbers for convenience.

At step S45, the lower-arm control unit 56 determines whether the flow direction of the phase current is the negative direction based on the phase current acquired at step S46, described hereafter.

When determined that the flow direction of the phase current is the negative direction at step S45, the lower-arm control unit 56 proceeds to step S41. Meanwhile, when determined that the flow direction is the positive direction at step S45, the lower-arm control unit 56 proceeds to step S42. Here, when the determination result is YES at step S32, the lower-arm control unit 56 proceeds to step S46 and acquires the phase current.

Other Embodiments

Here, the above-described embodiments may be modified in the following manner.

According to the third embodiment, the configuration for detecting the sense voltage is not a requisite for the drive circuits DrCH and DrCL.

In FIG. 4 according to the first embodiment, when the flow direction of the phase current is the positive direction, the gate voltage VgsL of the lower-arm switch SWL may start to be maintained at the negative voltage Vn from a timing that is after the start timing t4 of the fourth period P4 and before the end timing t5 of the fourth period P4, instead of the start timing t4. In addition, when the flow direction of the phase current is the negative direction, the gate voltage VgsH of the upper-arm switch SWH may start to be maintained at the negative voltage Vn from a timing that is after the start timing t1 of the second period P2 and before the end timing t2 of the second period P2, instead of the start timing t1.

The off-voltage Vc is not limited to 0 V and may be voltage that is higher than 0 V and lower than the threshold voltage Vth.

The upper-arm drive circuit DrCH and the lower-arm drive circuit DrCL of the same phase may be configured to be capable of exchanging information therebetween. In this case, for example, at step S14 in FIG. 7, the upper-arm control unit 46 may determine whether the timing is the switching timing based on the lower-arm driving signal SgL acquired from the lower-arm drive circuit DrCL. In addition, for example, at step S34 in FIG. 8, the lower-arm control unit 56 may determine whether the timing is the switching timing based on the upper-arm driving signal SgH acquired from the upper-arm drive circuit DrCH.

According to the above-described embodiments, the upper- and lower-arm drive circuits DrCH and DrCL are separately provided to respectively correspond to the upper- and lower-arm switches SWH and SWL. However, the present disclosure is not limited thereto. A common drive circuit may be provided for the upper- and lower-arm switches SWH and SWL.

The switch configuring the inverter is not limited to a MOSFET.

The switch configuring each arm of the inverter 20 is not limited to a single switch and may be a parallel-connection body of a plurality of switches.

While the present disclosure has been described with reference to embodiments, it is to be understood that the disclosure is not limited to the embodiments and constructions. The present disclosure covers various modification examples and modifications within the range of equivalency. In addition, various combinations and configurations, and further, other combinations and configurations including more, less, or only a single element thereof are also within the spirit and scope of the present disclosure.

What is claimed is:

1. A drive circuit for a switch that drives an upper-arm switch and a lower-arm switch that include body diodes, wherein:
    each of the upper-arm switch and the lower-arm switch includes a first terminal, a second terminal, and a control terminal, and the second terminal of the upper-arm switch is connected to the first terminal of the lower-arm switch;
    each of the upper-arm switch and the lower-arm switch is set to an on-state that allows a flow of current between the first terminal and the second terminal, as a result of a potential difference in the control terminal relative to the second terminal becoming equal to or greater than a threshold voltage, and an off-state that inhibits a flow of current in a direction from the first terminal towards the second terminal, as a result of the potential difference in the control terminal relative to the second terminal becoming less than the threshold voltage; and the drive circuit comprises:
  a voltage adjusting unit that adjusts applied voltages of the respective control terminals of the upper-arm switch and the lower-arm switch by having energization thereof controlled; and
  a control unit that performs energization control of the voltage adjusting unit such that the upper-arm switch and the lower-arm switch are alternately set to the on-state while interposing a dead time between the on-state of the upper-arm switch and the on-state of the lower-arm switch, wherein:

the control unit performs energization control of the voltage adjusting unit so as to maintain the electric potential of the control terminal relative to the second terminal of a target switch at a negative voltage over a period from a timing subsequent to a start timing of a dead time immediately after the target switch is switched to the off-state, until a point within a period over which an opposing arm switch is set to the on-state, and subsequently maintain the electric potential of the control terminal relative to the second terminal of the target switch at the off-voltage until a next dead time is ended;

the target switch is a switch that includes a target diode among the upper-arm switch and the lower-arm switch, the target diode being a diode through which a feedback current flows during the dead time among the body diodes respectively included in the upper-arm switch and the lower-arm switch;

the opposing arm switch is a switch other than the target switch;

the off-voltage is a voltage that is equal to or greater than 0 and less than the threshold voltage, and the negative voltage is a voltage that is less than 0;

the control unit performs energization control of the voltage adjusting unit so as to maintain the electric potential of the control terminal relative to the second terminal of the opposing arm switch at the negative voltage over a period from a timing subsequent to a start timing of a dead time immediately after the opposing arm switch is switched to the off-state, until a point within a period over which the target switch is set to the on-state, and subsequently maintain the electric potential of the control terminal relative to the second terminal of the opposing arm switch at the off-voltage until a next dead time is ended;

an inductive load is connected to a connection point of the upper-arm switch and the lower-arm switch;

the voltage adjusting unit comprises:
  an upper-arm voltage adjusting unit that adjusts the applied voltage of the control terminal of the upper-arm switch by having energization thereof controlled; and
  a lower-arm voltage adjusting unit that adjusts the applied voltage of the control terminal of the lower-arm switch by having energization thereof controlled;

the control unit comprises:
  an upper-arm driving unit that performs energization control of the upper-arm voltage adjusting unit; and
  a lower-arm driving unit that performs energization control of the lower-arm voltage adjusting unit, wherein each of the upper-arm switch and the lower-arm switch includes a sense terminal that outputs a minute current that is correlated with a current that flows between the first terminal and the second terminal, the upper-arm driving unit determines whether a current flow direction is a direction from the inductive load towards the connection point or a direction from the connection point towards the inductive load, based on the minute current outputted from the sense terminal of the upper-arm switch, when determined that a current flow direction is a direction from the inductive load towards the connection point, the upper-arm driving unit performs energization control of the upper-arm voltage adjusting unit so as to maintain the electric potential of the control terminal relative to the second terminal of the upper-arm switch at the negative voltage over a period from a timing subsequent to a start timing of a dead time, of the dead time immediately after the upper-arm switch serving as the target switch is switched to the off-state, until a point within a period over which the lower-arm switch serving as the opposing arm switch is set to the on-state, and subsequently maintain the electric potential of the control terminal relative to the second terminal of the upper-arm switch at the off-voltage until a next dead time is ended, and when determined that the current flow direction is a direction from the connection point towards the inductive load, the upper-arm driving unit performs energization control of the upper-arm voltage adjusting unit so as to maintain the electric potential of the control terminal relative to the second terminal of the upper-arm switch at the negative voltage over a period from a timing subsequent to a start timing of a dead time, of the dead time immediately after the upper-arm switch serving as the opposing arm switch is switched to the off-state, until a point within a period over which the lower-arm switch serving as the target switch is set to the on-state, and subsequently maintain the electric potential of the control terminal relative to the second terminal of the upper-arm switch at the off-voltage until a next dead time is ended;

the lower-arm driving unit determines whether a current flow direction is a direction from the inductive load towards the connection point or a direction from the connection point towards the inductive load, based on the minute current outputted from the sense terminal of the lower-arm switch, when determined that the current flow direction is a direction from the connection point towards the inductive load, the lower-arm driving unit performs energization control of the lower-arm voltage adjusting unit so as to maintain the electric potential of the control terminal relative to the second terminal of the lower-arm switch at the negative voltage over a period from a timing subsequent to a start timing of a dead time, of the dead time immediately after the lower-arm switch serving as the target switch is switched to the off-state, until a point within a period over which the upper-arm switch serving as the opposing arm switch is set to the on-state, and subsequently maintain the electric potential of the control terminal relative to the second terminal of the lower-arm switch at the off-voltage until a next dead time is ended, and when determined that the current flow direction is a direction from the inductive load towards the connection point, the lower-arm driving unit performs energization control of the lower-arm voltage adjusting unit so as to maintain the electric potential of the control terminal relative to the second terminal of the lower-arm switch at the negative voltage over a period from a timing subsequent to a start timing of a dead time, of the dead time immediately after the lower-arm switch serving as the opposing arm switch is switched to the off-state, until a point within a period over which the upper-arm switch serving as the target switch is set to the on-state, and subsequently maintain the electric potential of the control terminal relative to the second terminal of the lower-arm switch at the off-voltage until a next dead time is ended;

the upper-arm driving unit determines whether an upper-arm driving signal for the upper-arm switch is to be switched from an on-command to an off-command at a current processing cycle, when determined that the upper-arm driving signal is not to be switched from the on-command to the off-command, the upper-arm driving unit determines whether the upper-arm driving signal is the on-command, when determined that the upper-arm driving signal is the on-command, the upper-arm driving unit sets the electric potential of the control terminal relative to the second terminal of the upper-arm switch to the on-voltage, when determined that the upper-arm driving signal is not the on-command, the upper-arm driving unit sets the electric potential of the control terminal relative to the second terminal of the upper-arm switch to the off voltage, when determined that the upper-arm driving signal is switched from the on-command to the off-command, the upper-arm driving unit determines whether it is a timing at which the electric potential of the control terminal relative to the second terminal of the upper-arm switch is switched to the off-voltage, the timing being a timing after the lower-arm switch is switched to the on-state and a timing at which self turn-on of the upper-arm switch does not occur, when determined that it is the timing, the upper-arm driving unit sets the electric potential of the control terminal relative to the second terminal of the upper-arm switch to the off voltage, and when determined that it is not the timing, the upper-arm driving unit sets the electric potential of the control terminal relative to the second terminal of the upper-arm switch to the negative voltage; and the lower-arm driving unit determines whether a lower-arm driving signal for the lower-arm switch is to be switched from an on-command to an off-command at a current processing cycle, when determined that the lower-arm driving signal is not to be switched from the on-command to the off-command, the lower-arm driving unit determines whether the lower-arm driving signal is the on-command, when determined that the lower-arm driving signal is the on-command, the lower-arm driving unit sets the electric potential of the control terminal relative to the second terminal of the lower-arm switch to the on-voltage, when determined that the lower-arm driving signal is not the on-command, the lower-arm driving unit sets the electric potential of the control terminal relative to the second terminal of the lower-arm switch to the off voltage, when determined that the lower-arm driving signal is switched from the on-command to the off-command, the lower-arm driving unit determines whether it is a timing at which the electric potential of the control terminal relative to the second terminal of the lower-arm switch is switched to the off-voltage, the timing being a timing after the upper-arm switch is switched to the on-state and a timing at which self turn-on of the lower-arm switch does not occur, when determined that it is the timing, the lower-arm driving unit sets the electric potential of the control terminal relative to the second terminal of the lower-arm switch to the off voltage, and when determined that it is not the timing, the lower-arm driving unit sets the electric potential of the control terminal relative to the second terminal of the lower-arm switch to the negative voltage.

2. A drive circuit for a switch that drives an upper-arm switch and a lower-arm switch that include body diodes, wherein:

each of the upper-arm switch and the lower-arm switch includes a first terminal, a second terminal, and a control terminal, and the second terminal of the upper-arm switch is connected to the first terminal of the lower-arm switch;

each of the upper-arm switch and the lower-arm switch is set to an on-state that allows a flow of current between the first terminal and the second terminal, as a result of a potential difference in the control terminal relative to the second terminal becoming equal to or greater than a threshold voltage, and an off-state that inhibits a flow of current in a direction from the first terminal towards the second terminal, as a result of the potential difference in the control terminal relative to the second terminal becoming less than the threshold voltage; and the drive circuit comprises:

a voltage adjusting unit that adjusts applied voltages of the respective control terminals of the upper-arm switch and the lower-arm switch by having energization thereof controlled; and a control unit that performs energization control of the voltage adjusting unit such that the upper-arm switch and the lower-arm switch are alternately set to the on-state while interposing a dead time between the on-state of the upper-arm switch and the on-state of the lower-arm switch, wherein:

the control unit performs energization control of the voltage adjusting unit so as to maintain the electric potential of the control terminal relative to the second terminal of a target switch at a negative voltage over a period from a timing subsequent to a start timing of a dead time immediately after the target switch is switched to the off-state, until a point within a period over which an opposing arm switch is set to the on-state, and subsequently maintain the electric potential of the control terminal relative to the second terminal of the target switch at the off-voltage until a next dead time is ended;

the target switch is a switch that includes a target diode among the upper-arm switch and the lower-arm switch, the target diode being a diode through which a feedback current flows during the dead time among the body diodes respectively included in the upper-arm switch and the lower-arm switch;

the opposing arm switch is a switch other than the target switch;

the off-voltage is a voltage that is equal to or greater than 0 and less than the threshold voltage, and the negative voltage is a voltage that is less than 0;

the control unit performs energization control of the voltage adjusting unit so as to maintain the electric potential of the control terminal relative to the second terminal of the opposing arm switch at the negative voltage over a period from a timing subsequent to a start timing of a dead time immediately after the opposing arm switch is switched to the off-state, until a point within a period over which the target switch is set to the on-state, and subsequently maintain the electric potential of the control terminal relative to the second terminal of the opposing arm switch at the off-voltage until a next dead time is ended;

an inductive load is connected to a connection point of the upper-arm switch and the lower-arm switch;

the voltage adjusting unit comprises:
an upper-arm voltage adjusting unit that adjusts the applied voltage of the control terminal of the upper-arm switch by having energization thereof controlled; and
a lower-arm voltage adjusting unit that adjusts the applied voltage of the control terminal of the lower-arm switch by having energization thereof controlled;

the control unit comprises:
an upper-arm driving unit that performs energization control of the upper-arm voltage adjusting unit; and
a lower-arm driving unit that performs energization control of the lower-arm voltage adjusting unit, wherein the drive circuit is applied to a system that includes a current detecting unit that is provided between the connection point of the upper-arm switch and the lower-arm switch and the inductive load, and detects a current that flows between the connection point and the inductive load, the upper-arm driving unit determines whether a current flow direction is a direction from the inductive load towards the connection point or a direction from the connection point towards the inductive load, based on a detection value of the current detecting unit, when determined that a current flow direction is a direction from the inductive load towards the connection point, the upper-arm driving unit performs energization control of the upper-arm voltage adjusting unit so as to maintain the electric potential of the control terminal relative to the second terminal of the upper-arm switch at the negative voltage over a period from a timing subsequent to a start timing of a dead time, of the dead time immediately after the upper-arm switch serving as the target switch is switched to the off-state, until a point within a period over which the lower-arm switch serving as the opposing arm switch is set to the on-state, and subsequently maintain the electric potential of the control terminal relative to the second terminal of the upper-arm switch at the off-voltage until a next dead time is ended, and when determined that the current flow direction is a direction from the connection point towards the inductive load, the upper-arm driving unit performs energization control of the upper-arm voltage adjusting unit so as to maintain the electric potential of the control terminal relative to the second terminal of the upper-arm switch at the negative voltage over a period from a timing subsequent to a start timing of a dead time, of the dead time immediately after the upper-arm switch serving as the opposing arm switch is switched to the off-state, until a point within a period over which the lower-arm switch serving as the target switch is set to the on-state, and subsequently maintain the electric potential of the control terminal relative to the second terminal of the upper-arm switch at the off-voltage until a next dead time is ended;

the lower-arm driving unit determines whether a current flow direction is a direction from the inductive load towards the connection point or a direction from the connection point towards the inductive load, based on the detection value of the current detecting unit, when determined that the current flow direction is a direction from the connection point towards the inductive load, the lower-arm driving unit performs energization control of the lower-arm voltage adjusting unit so as to maintain the electric potential of the control terminal relative to the second terminal of the lower-arm switch at the negative voltage over a period from a timing subsequent to a start timing of a dead time, of the dead time immediately after the lower-arm switch serving as the target switch is switched to the off-state, until a point within a period over which the upper-arm switch serving as the opposing arm switch is set to the on-state, and subsequently maintain the electric potential of the control terminal relative to the second terminal of the lower-arm switch at the off-voltage until a next dead time is ended, and when determined that the current flow direction is a direction from the inductive load towards the connection point, the lower-arm driving unit performs energization control of the lower-arm voltage adjusting unit so as to maintain the electric potential of the control terminal relative to the second terminal of the lower-arm switch at the negative voltage over a period from a timing subsequent to a start timing of a dead time, of the dead time immediately after the lower-arm switch serving as the opposing arm switch is switched to the off-state, until a point within a period over which the upper-arm switch serving as the target switch is set to the on-state, and subsequently maintain the electric potential of the control terminal relative to the second terminal of the lower-arm switch at the off-voltage until a next dead time is ended;

the upper-arm driving unit determines whether an upper-arm driving signal for the upper-arm switch is to be switched from an on-command to an off-command at a current processing cycle, when determined that the upper-arm driving signal is not to be switched from the on-command to the off-command, the upper-arm driving unit determines whether the upper-arm driving signal is the on-command, when determined that the upper-arm driving signal is the on-command, the upper-arm driving unit sets the electric potential of the control terminal relative to the second terminal of the upper-arm switch to an on-voltage, when determined that the upper-arm driving signal is not the on-command, the upper-arm driving unit sets the electric potential of the control terminal relative to the second terminal of the upper-arm switch to the off voltage, when determined that the upper-arm driving signal is switched from the on-command to the off-command, the upper-arm driving unit determines whether it is a timing at which the electric potential of the control terminal relative to the second terminal of the upper-arm switch is switched to the off-voltage, the timing being a timing after the lower-arm switch is switched to the on-state and a timing at which self turn-on of the upper-arm switch does not occur, when determined that it is the timing, the upper-arm driving unit sets the electric potential of the control terminal relative to the second terminal of the upper-arm switch to the off voltage, when determined that it is not the timing, the upper-arm driving unit sets the electric potential of the control terminal relative to the second terminal of the upper-arm switch to he the negative voltage; and the lower-arm driving unit determines whether a lower-arm driving signal for the lower-arm switch is to be switched from an on-command to an off-command at a current processing cycle, when determined that the lower-arm driving signal is not to be switched from the on-command to the off-command, the lower-arm driving unit determines whether the lower-arm driving signal is the on-command, when determined that the lower-arm driving signal is the on-command, the lower-arm driving unit sets the electric potential of the control terminal relative to the second terminal of the lower-arm switch to the on-voltage, when determined that the lower-arm driving signal is not the on-command, the lower-arm driving unit sets the electric potential of the control terminal relative to the second terminal of the lower-arm switch to the off voltage, when determined that the lower-arm driving signal is switched from the on-command to the off-command, the lower-arm driving unit determines whether it is a timing at which the electric potential of the control terminal relative to the second terminal of the lower-arm switch is switched to the off-voltage, the timing being a timing after the upper-arm switch is switched to the on-state and a timing at which self turn-on of the lower-arm switch does not occur, when determined that it is the timing, the lower-arm driving unit sets the electric potential of the control terminal relative to the second terminal of the lower-arm switch to the off voltage, and when determined that it is not the timing, the lower-arm driving unit sets the electric potential of the control terminal relative to the second terminal of the lower-arm switch to the negative voltage.

\* \* \* \* \*